US010429510B2

(12) United States Patent
Tanisue

(10) Patent No.: US 10,429,510 B2
(45) Date of Patent: Oct. 1, 2019

(54) SENSOR AND METHOD FOR SETTING THRESHOLD OF SENSOR

(71) Applicant: OMRON Corporation, Kyoto-shi, Kyoto (JP)

(72) Inventor: Kohei Tanisue, Kameoka (JP)

(73) Assignee: OMRON Corporation, Kyoto-shi (JP)

( * ) Notice: Subject to any disclaimer, the term of this patent is extended or adjusted under 35 U.S.C. 154(b) by 90 days.

(21) Appl. No.: 15/786,318

(22) Filed: Oct. 17, 2017

(65) Prior Publication Data
US 2018/0210082 A1    Jul. 26, 2018

(30) Foreign Application Priority Data
Jan. 24, 2017    (JP) ................................. 2017-010385

(51) Int. Cl.
  H01J 40/14    (2006.01)
  G01S 17/02    (2006.01)
  G01J 1/44    (2006.01)
  G01J 3/50    (2006.01)
  G01V 8/16    (2006.01)
  (Continued)

(52) U.S. Cl.
  CPC .............. *G01S 17/026* (2013.01); *G01J 1/44* (2013.01); *G01J 3/50* (2013.01); *G01S 7/4802* (2013.01); *G01S 7/4813* (2013.01); *G01S 7/4818* (2013.01); *G01S 7/497* (2013.01); *G01V 8/16* (2013.01); *H03K 17/78* (2013.01); *H03K 17/9627* (2013.01); *H03K 2217/94026* (2013.01)

(58) Field of Classification Search
  CPC ...... G01S 7/4802; G01S 7/4818; G01S 7/497; G01S 17/026; G01J 1/44

USPC .................................... 250/214 R, 221, 222.1
See application file for complete search history.

(56) References Cited

U.S. PATENT DOCUMENTS

2004/0200978 A1    10/2004    Kamijo
2005/0199786 A1    9/2005    Yoshida et al.
(Continued)

FOREIGN PATENT DOCUMENTS

CN    1536536 A    10/2004
CN    2831049 Y    10/2006
(Continued)

OTHER PUBLICATIONS

Office action dated Apr. 2, 2019 in a counterpart Chinese patent application.

Primary Examiner — Kevin K Pyo
(74) Attorney, Agent, or Firm — Metrolex IP Law Group, PLLC

(57) ABSTRACT

A photoelectric sensor is configured to detect an object by reception of light from a light projecting unit in a light receiving unit. The photoelectric sensor differentiates a sampled light reception amount with respect to time to calculate a variation in the light reception amount per unit time, and sets as a threshold a light reception amount corresponding to an extreme value of the variation in the light reception amount. In this manner, the threshold is set with the variation in the light reception amount per unit time taken into account, thereby enhancing the accuracy in detection of the object by comparison between the light reception amount and the threshold, to allow minimization of jitter of a detection signal from the photoelectric sensor to a programmable logic controller.

17 Claims, 16 Drawing Sheets

(51) Int. Cl.
  *H03K 17/78* (2006.01)
  *G01S 7/48* (2006.01)
  *G01S 7/481* (2006.01)
  *G01S 7/497* (2006.01)
  *H03K 17/96* (2006.01)

(56) References Cited

U.S. PATENT DOCUMENTS

| | | |
|---|---|---|
| 2011/0215221 A1 | 9/2011 | Nakamura et al. |
| 2011/0218766 A1* | 9/2011 | Nakamura ............... G01V 8/10 702/176 |
| 2013/0144562 A1 | 6/2013 | Ohmae et al. |
| 2014/0168653 A1 | 6/2014 | Kida et al. |
| 2016/0084959 A1 | 3/2016 | Shirai et al. |

FOREIGN PATENT DOCUMENTS

| | | |
|---|---|---|
| CN | 101349575 A | 1/2009 |
| CN | 102193111 A | 9/2011 |
| CN | 102193112 A | 9/2011 |
| CN | 103109163 A | 5/2013 |
| CN | 103889256 A | 6/2014 |
| CN | 104394278 A | 3/2015 |
| CN | 105264404 A | 1/2016 |
| CN | 105788125 A | 7/2016 |
| JP | 2013-102424 A | 5/2013 |

\* cited by examiner

Light-on mode (reference example)

Light-on mode (present embodiment)

Dark-on mode (reference example)

Dark-on mode (present embodiment)

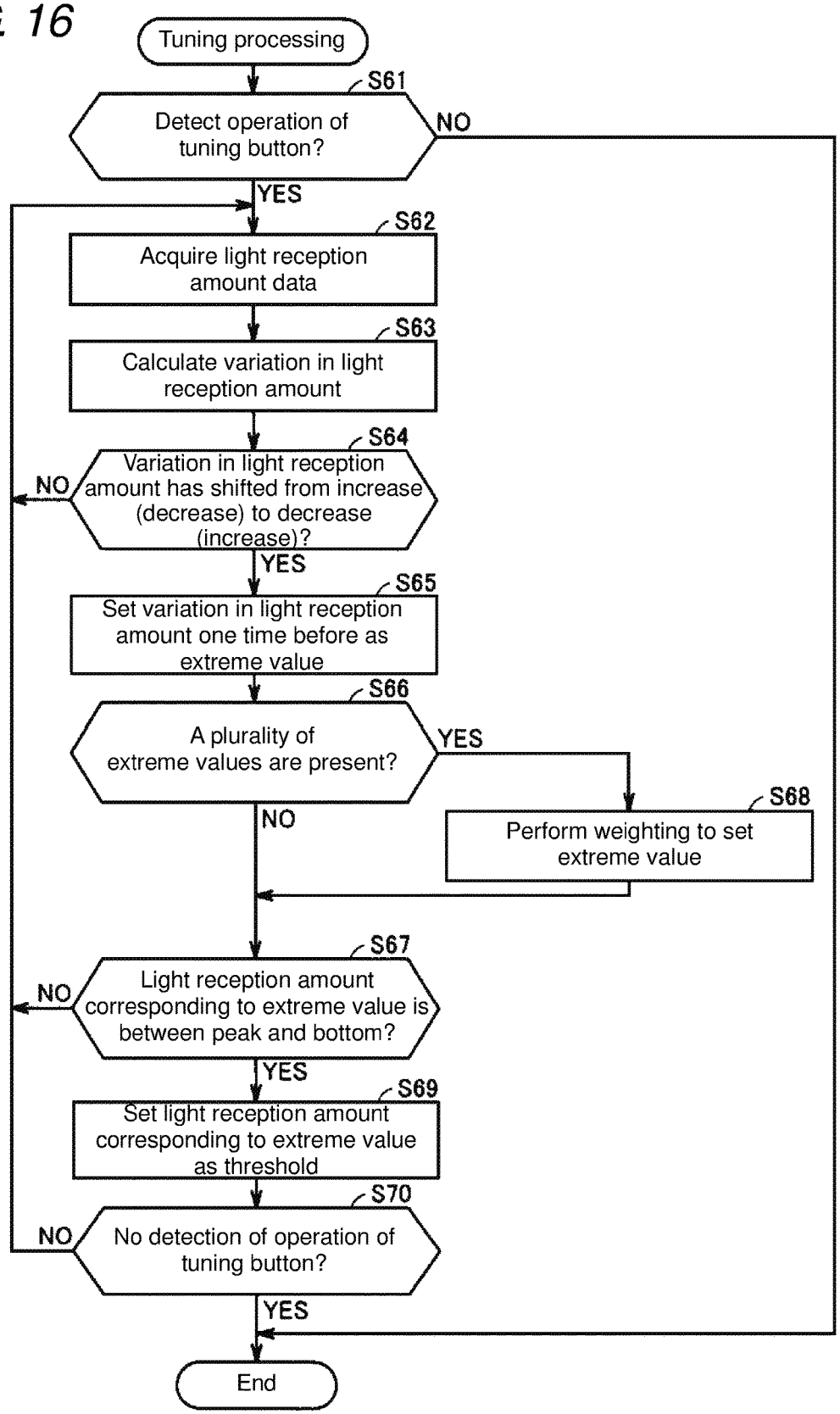

SENSOR AND METHOD FOR SETTING THRESHOLD OF SENSOR

CROSS-REFERENCE TO RELATED APPLICATION

This application is based on Japanese Patent Application No. 2017-010385 filed with the Japan Patent Office on Jan. 24, 2017, the entire contents of which are incorporated herein by reference.

FIELD

The disclosure relates to a sensor for detecting an object by reception of light from a light projecting unit in a light receiving unit, and relates to a method for setting a threshold of the sensor.

BACKGROUND

There has been known a sensor for detecting an object by reception of light from a light projecting unit in a light receiving unit. For example, Japanese Unexamined Patent Publication No. 2013-102424 discloses a photoelectric sensor in which a light receiving unit receives light projected from a light projecting unit, and an object is detected based on whether or not a light reception amount of the light received by the light receiving unit exceeds a previously set threshold. In this photoelectric sensor, an intermediate value between the maximum light reception amount in the case of absence of the object and the minimum light reception amount in the case of presence of the object is set as the threshold.

As the photoelectric sensor disclosed in Japanese Unexamined Patent Publication No. 2013-102424, when the intermediate value between the maximum light reception amount and the minimum light reception amount is set as the threshold while a change in the light reception amount is ignored, a change in the light reception amount in the vicinity of the threshold may be gentle. When such a threshold is set, the photoelectric sensor has a certain degree of extension in the range for decision on detection of the object, and variations might occur in timing for outputting a detection result. Therefore, when machine control, trigger input for an image sensor, or the like is to be performed based on the detection result from the photoelectric sensor, the photoelectric sensor disclosed in Japanese Unexamined Patent Publication No. 2013-102424 has a problem of deviation of the control timing.

SUMMARY

One or more aspects have been made for solving the above problem, and may provide a sensor that can detect an object with high accuracy by comparison between a light reception amount and a threshold, and a method for setting the threshold of the sensor.

According to one aspect of the present disclosure, a sensor detects an object by reception of light from a light projecting unit in a light receiving unit. The sensor includes a sampling unit, a calculator, a setting unit, and a detector. The sampling unit samples a light reception amount of the light received by the light receiving unit. The calculator calculates a variation in the light reception amount per unit time based on the light reception amount sampled by the sampling unit. The setting unit sets as a threshold a light reception amount corresponding to the variation in the light reception amount per unit time when the variation in the light reception amount per unit time satisfies a predetermined condition. The detector detects the object by comparison between the light reception amount of the light received by the light receiving unit and the threshold.

With the above configuration, when a variation in the light reception amount per unit time satisfies the predetermined condition, a light reception amount corresponding to the variation in the light reception amount per unit time is set as a threshold. In this manner, the threshold is set with the variation in the light reception amount per unit time taken into account, thereby enhancing the accuracy in detection of the object by comparison between the light reception amount and the threshold.

It may be preferable that the sampling unit samples the light reception amount of the light received by the light receiving unit with a constant period.

With the above configuration, the variation in the light reception amount per unit time can be easily calculated based on the sampled light reception amount.

It may be preferable that the calculator calculates a further variation per unit time of the variation in the light reception amount per unit time. When the further variation per unit time is larger than a defined value, the setting unit excludes the light reception amount corresponding to the further variation per unit time from being a threshold setting target.

With the above configuration, when the further variation per unit time is larger than the defined value, it may have been influenced by noise or the like. Even in such a case, the light reception amount corresponding to the further variation per unit time is excluded from being the threshold setting target, thereby enhancing the accuracy in detection of the object by comparison between the light reception amount and the threshold.

It may be preferable that, when a plurality of variations in the light reception amount per unit time satisfy the predetermined condition, the setting unit sets the threshold based on results of weighting respective light reception amounts corresponding to the plurality of variations in the light reception amount per unit time.

With the above configuration, even when a plurality of variations in the light reception amount per unit time satisfy the predetermined condition, the threshold is set by weighting, thereby enhancing the accuracy in detection of the object by comparison between the light reception amount and the threshold.

It may be preferable that, while the detector detects the object by using the threshold, the setting unit updates the threshold to a newly set threshold based on the light reception amount sampled by the sampling unit.

With the above configuration, even during detection of the object by using the threshold, the threshold is updated, thereby enhancing the accuracy in detection of the object by comparison between the light reception amount and the threshold.

According to one aspect of the present disclosure, a method for setting a threshold of a sensor is a method for setting a threshold of a sensor which detects an object by reception of light from a light projecting unit in a light receiving unit and by comparison between a light reception amount of the light received by the light receiving unit and a threshold. The method for setting a threshold of the sensor includes the steps of: sampling the light reception amount of the light received by the light receiving unit; calculating a variation in the light reception amount per unit time based on the light reception amount sampled by the sampling unit; and setting as the threshold a light reception amount corresponding to the variation in the light reception amount per unit time when the variation in the light reception amount per unit time satisfies a predetermined condition.

According to the above method, when the variation in the light reception amount per unit time satisfies a predetermined condition, a light reception amount corresponding to the variation in the light reception amount per unit time is set as the threshold. In this manner, the threshold is set with the variation in the light reception amount per unit time taken into account, thereby enhancing the accuracy in detection of the object by comparison between the light reception amount and the threshold.

According to the present disclosure, the threshold is set with the variation in the light reception amount per unit time taken into account, thereby enhancing the accuracy in detection of the object by comparison between the light reception amount and the threshold.

BRIEF DESCRIPTION OF THE DRAWINGS

FIG. 16 is a flowchart illustrating tuning processing that is executed by a controller of a photoelectric sensor according to a third modified example.

DETAILED DESCRIPTION

Embodiments will be described in detail with reference to the drawings. In the following drawings, the same or corresponding portions are provided with the same numeral and the description thereof will not be repeated.

Appearance of Photoelectric Sensor

Figure 1:
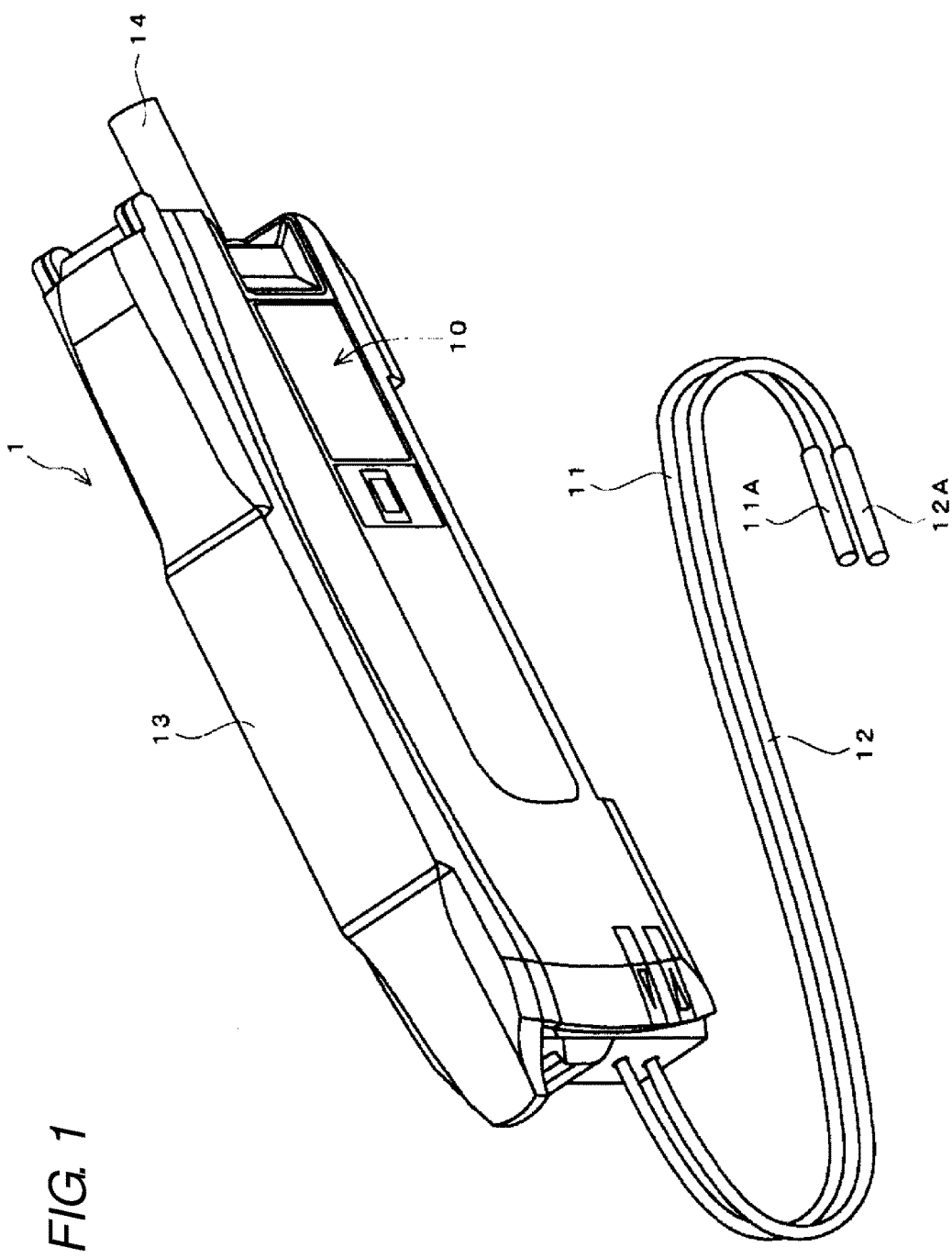
FIG. 1 is a view illustrating an appearance of an optical fiber type photoelectric sensor as one embodiment of a photoelectric sensor.
Figure 2:
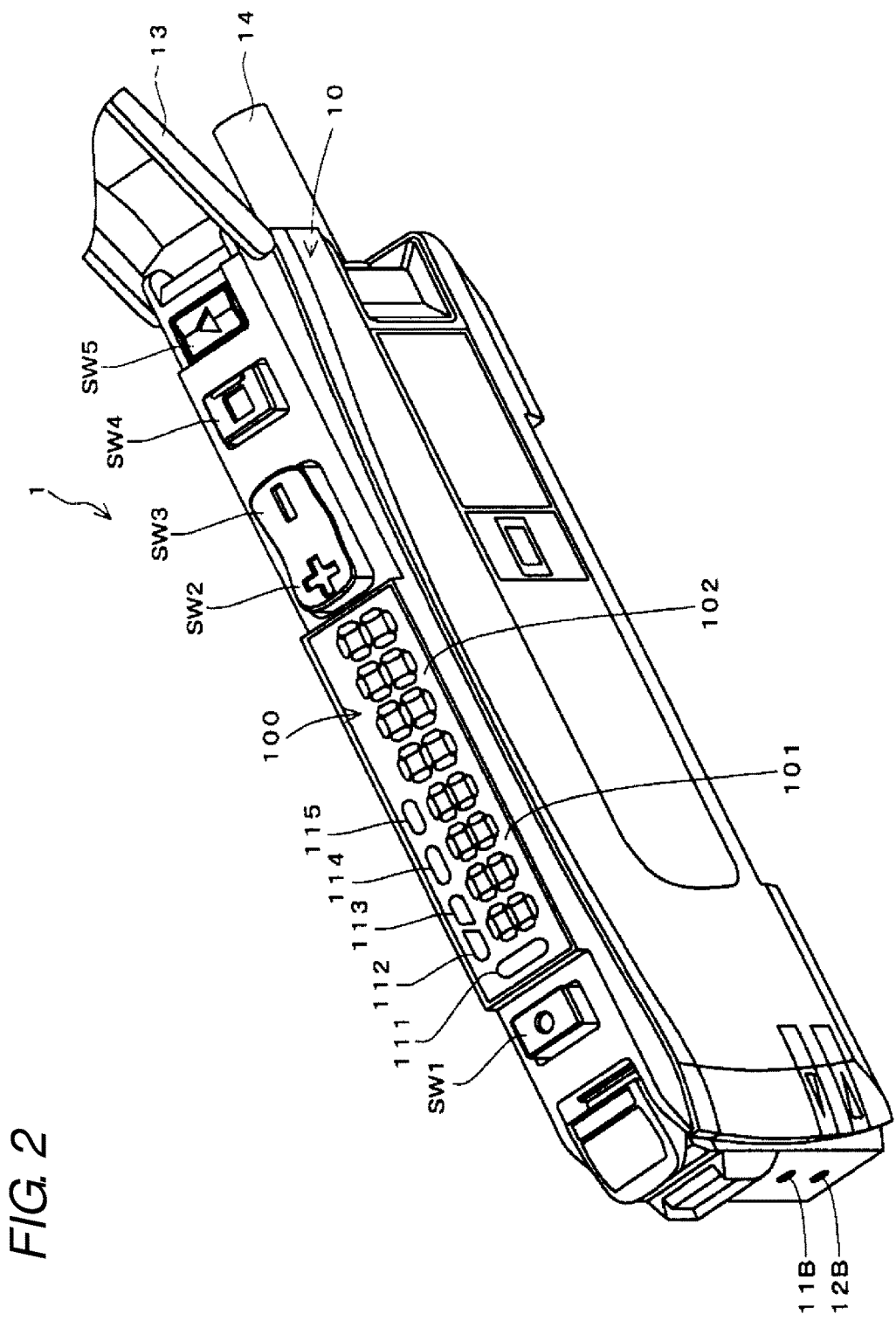
FIG. 2 is a view illustrating an appearance of an optical fiber type photoelectric sensor as one embodiment of a photoelectric sensor.

FIGS. 1 and 2 are views each illustrating an appearance of an optical fiber type photoelectric sensor 1 as one embodiment of the photoelectric sensor.

As illustrated in FIG. 1, the photoelectric sensor 1 is provided with a body 10, and a pair of optical fibers 11, 12 mounted on the front surface of the body 10. The optical fiber 11 is a light-projecting optical fiber. The optical fiber 12 is a light-receiving optical fiber. Heads 11A, 12A respectively including lenses are fitted to leading end portions of the respective optical fibers 11, 12. Note that the optical fibers 11, 12 may be longer than illustrated.

As illustrated in FIG. 2, the optical fibers 11, 12 are respectively inserted into insertion ports 11B, 12B on the front surface of the body 10. A light projecting unit 103 described later is provided in the vicinity of the insertion port 11B of the optical fiber 11. A light receiving unit 104 described later is provided in the vicinity of the insertion port 12B of the light-receiving optical fiber 12. A connecting cable 14 is led out from the rear surface of the body 10.

In the photoelectric sensor 1, the light receiving unit 104 receives light projected from the light projecting unit 103. Modes for detecting an object by the photoelectric sensor 1 include a "light-on mode" and a "dark-on mode."

In the light-on mode, a head is provided and shared by the light projecting unit 103 and the light receiving unit 104, and the head is disposed toward a detection area. When light projected from the light projecting unit 103 is reflected by an object at the time of the object intersecting the light and when a light reception amount obtained by the light receiving unit 104 having received the reflected light is larger than a previously set threshold, the photoelectric sensor 1 judges that "the object is present." At this time, output by an output unit 108 described later comes into an on-state. Note that in the light-on mode, a detectable object is restricted to an object that reflects light, such as a metal. As thus described, in the light-on mode, the photoelectric sensor 1 functions as a reflection-type sensor.

In the dark-on mode, the light projecting unit 103 and the light receiving unit 104 are disposed facing each other. When a light path between the light projecting unit 103 and the light receiving unit 104 is blocked by the object intersecting the light path and when a light reception amount obtained by the light receiving unit 104 is smaller than the threshold, the photoelectric sensor 1 judges that "the object is present." At this time, the output by the output unit 108 comes into the on-state. As thus described, in the dark-on mode, the photoelectric sensor 1 functions as a transmission-type sensor.

Digital data showing the light reception amount obtained by the light receiving unit 104 (hereinafter also referred to as light reception amount data) is inputted into a controller 105 described later. The controller 105 judges whether the object is present or absent by comparing the light reception amount data and the threshold. The output unit 108 outputs a result of the judgment to the outside.

Figure 3:
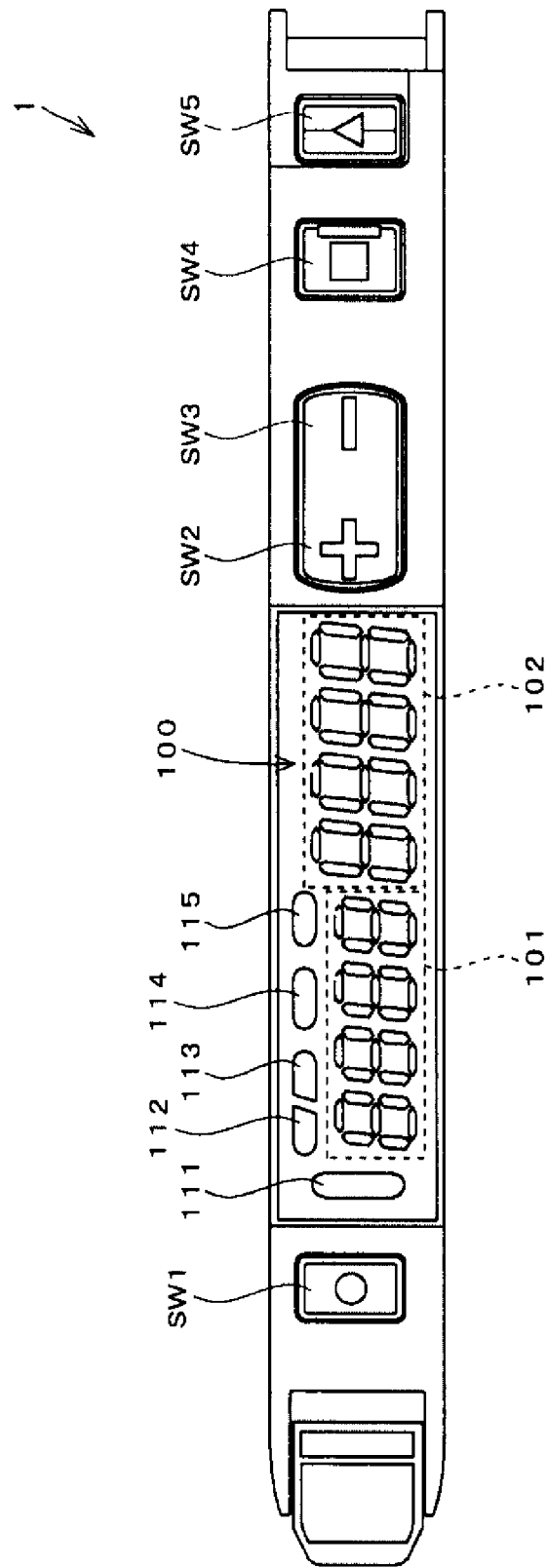
FIG. 3 is a view illustrating an upper surface of a photoelectric sensor seen from the top.

A display 100 and a plurality of press button switches SW1 to SW5 are provided on the upper surface of the body 10. The cover 13 covers the upper surface during use of the sensor, but at the time of setting or the like, the cover 13 is opened to allow operation of each of the press button switches SW1 to SW5. FIG. 2 illustrates the body 10 with the cover 13 in the opened state. FIG. 3 is a view of the upper surface of the photoelectric sensor 1 seen from the top. With the cover 13 being transparent, even when the cover 13 is mounted, the user can see a display of the display 100 through the cover 13. Note that the cover 13 is omitted in FIG. 3.

A configuration of the upper surface of the body 10 will be described with reference to FIGS. 2 and 3. As illustrated in FIGS. 2 and 3, the press button switch SW1 is disposed in a position close to the front surface of the body 10, and the display 100 is provided behind the press button switch SW1. Further, four press button switches SW2, SW3, SW4, SW5 are disposed behind the display 100. Although button portions of the press button switches SW2, SW3 are integrated, switch bodies thereof (illustration omitted) in the body 10 are independent of each other.

The display 100 is provided with a pair of indicators 101, 102 and five indication lamps 111 to 115. Each of the indicators 101, 102 is formed by combining four seven-segment light emitting diodes (LEDs), and displays a number within four digits or an alphabet letter string.

The front press button switch SW1 is used for tuning processing, and also referred to as a tuning button. In an embodiment, the tuning processing is executed while the tuning button is operated to set the threshold.

The pair of press button switches SW2, SW3 behind the display 100 is used for changing a numeric value displayed in the indicators 101, 102 and a sub menu. The press button switch SW4 is used to switch between a setting mode and a detection mode for performing detection processing of detecting the object, or used to select or decide a main menu of the detection mode.

In the detection mode, whether the object is present or absent is judged by comparison between a light reception amount, obtained by the light receiving unit 104 by projection of light from the light projecting unit 103, and the previously set threshold. Judging that "the object is present" is also referred to as detecting the object.

When some setting is made in the setting mode, the set contents are decided. When the press button switch SW4 is used to switch the mode to the detection mode, detection is started according to the set contents.

The press button switch SW5 is used for switching an output form of the photoelectric sensor 1. Specifically, the mode is switched to the "light-on mode" in which the output is brought into the on-state when the light reception amount becomes larger than or equal to the threshold, and the mode is switched to the "dark-on mode" in which the output is brought into the on-state when the light reception amount becomes smaller than or equal to the threshold.

The indicating lamp 111 is on while the photoelectric sensor 1 is detecting the object in the detection processing. The indicating lamp 112 is on while the light-on mode is being selected. The indicating lamp 113 is on while the dark-on mode is being selected. The indicating lamp 114 is on while the processing of automatically adjusting the light reception amount on the display is enabled. The indicating lamp 115 is off during initialization, and is on all the time after tuning.

[Electric Configuration of Photoelectric Sensor]

Figure 4:
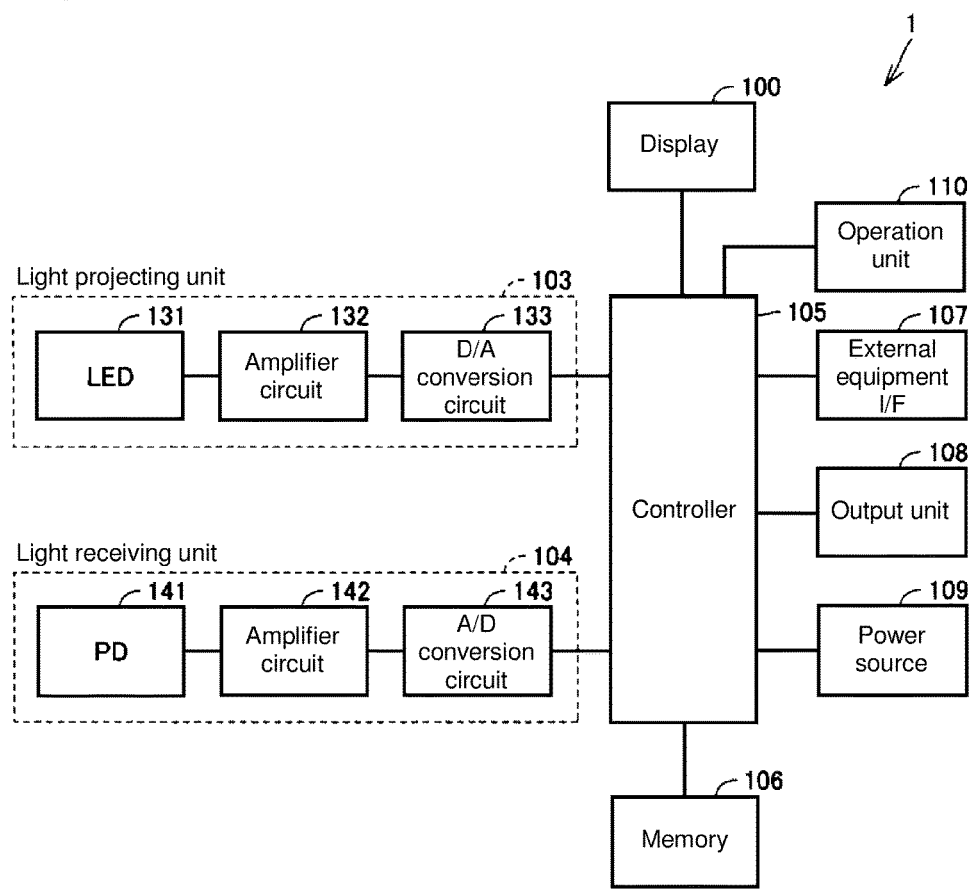
FIG. 4 is a block diagram illustrating an electrical configuration of a photoelectric sensor.

FIG. 4 is a block diagram illustrating an electrical configuration of the photoelectric sensor 1. As illustrated in FIG. 4, the photoelectric sensor 1 includes the controller 105, the light projecting unit 103, the light receiving unit 104, a memory 106, the display 100, the operation unit 110, an external equipment interface 107, the output unit 108, and a power source 109. The light projecting unit 103, the light receiving unit 104, the memory 106, the display 100, the operation unit 110, the external equipment interface 107, the output unit 108, and the power source 109 are each connected to the controller 105.

The controller 105 includes a processor, for example, and achieves the contents of the control according to an embodiment by the processor executing a predetermined program. The processor is achieved by a central processing unit (CPU), a micro processing unit (MPU), a field programmable gate array (FPGA), or some other device.

The display 100 includes the indicators 101, 102 and the indicating lamps 111 to 115, described above. The operation unit 110 includes each of the press button switches SW1 to SW5. The light projecting unit 103 includes an LED 131, an amplifier circuit 132, and a D/A conversion circuit 133. The light receiving unit 104 includes a photodiode (PD) 141, an amplifier circuit 142, and an A/D conversion circuit 143.

In the light projecting unit 103, a digital signal from the controller 105 is processed by the D/A conversion circuit 133 and the amplifier circuit 132, to emit light from the LED 131. In the light receiving unit 104, an analog signal from the photodiode 141 is processed by the amplifier circuit 142 and the A/D conversion circuit 143, to generate digital data showing a light reception amount (light reception amount data) and input the light reception amount data into the controller 105.

The controller 105 executes the detection processing based on the light reception amount data inputted from the light receiving unit 104, while controlling the light projecting unit 103 and the light receiving unit 104, in accordance with a program stored in the memory 106. A result of the detection by the detection processing is outputted to a programmable logic controller (PLC) 201, described later, via the output unit 108 or the external equipment interface 107.

Note that the photoelectric sensor 1 may be provided with a media driver as an interface for the controller 105 to read and write data from and into a storage medium. The storage medium is mountable into and removable from the photoelectric sensor 1 The controller 105 may execute a program stored in the storage medium. Examples of such a storage medium include mediums for storing a program in a nonvolatile manner, such as a compact disk read-only memory (CD-ROM), a digital versatile disk read-only memory (DVD-ROM), a universal serial bus (USB) memory, a memory card, a flexible disk (FD), a hard disk, a magnetic tape, a cassette tape, a magnetic optical disk (MO), a mini disk (MD), an integrated circuit (IC) card (not including a memory card), an optical card, a mask ROM, an EPROM, and an electronically erasable programmable read only memory (EEPROM).

Functional Configuration of Controller

Figure 5:
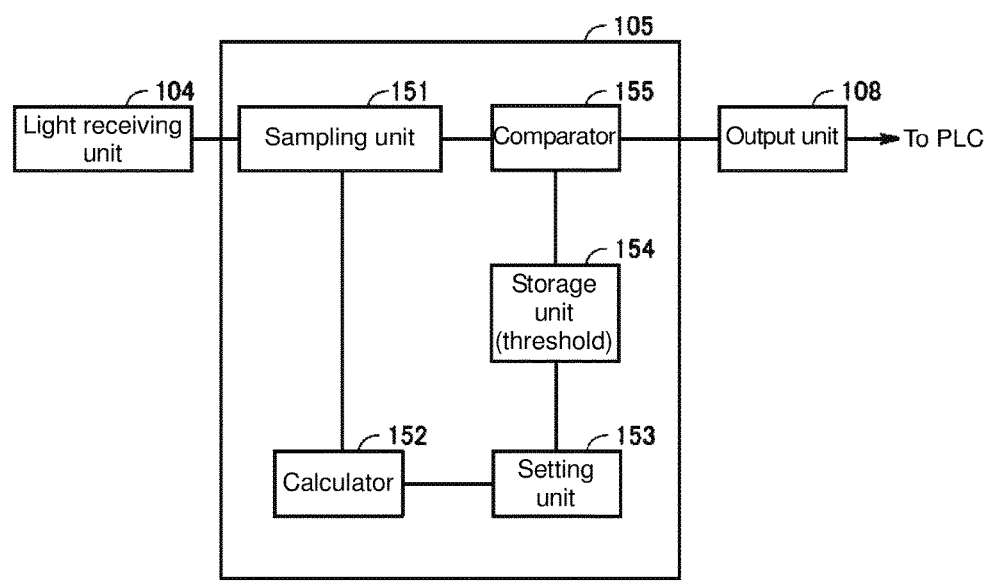
FIG. 5 is a block diagram illustrating a functional configuration of a controller.

FIG. 5 is a block diagram illustrating a functional configuration of the controller 105. Note that FIG. 5 mainly illustrates a functional configuration corresponding to the light receiving unit 104, out of functional configurations of the controller 105. As illustrated in FIG. 5, the controller 105 includes a sampling unit 151, a calculator 152, a setting unit 153, a storage unit 154, and a comparator 155. The sampling unit 151 is connected to the light receiving unit 104. The comparator 155 is connected to the output unit 108.

Based on the light reception amount data inputted from the light receiving unit 104, the sampling unit 151 samples the light reception amount obtained by the light receiving unit 104. In an embodiment, the sampling unit 151 samples the light reception amount data, inputted from the light receiving unit 104 every moment, with a constant period (e.g. a period of 0.1 seconds). The light reception amount data sampled by the sampling unit 151 is outputted to the calculator 152.

The calculator 152 calculates a variation in the light reception amount per unit time based on the light reception amount data sampled by the sampling unit 151. In an embodiment, the threshold is set with a variation in the light reception amount per unit time taken into account, calculated in the calculator 152, rather than by simply setting an intermediate value between the maximum light reception amount and the minimum light reception amount as the threshold as in a reference example described later. Specifically, in an embodiment, the calculator 152 differentiates the light reception amount sampled by the sampling unit 151 with respect to time to calculate a variation in the light reception amount per unit time (hereinafter also referred to as a variation in the light reception amount). The variation in the light reception amount calculated by the calculator 152 is outputted to the setting unit 153.

The setting unit 153 sets a threshold to be used for the detection processing based on the variation in the light reception amount calculated by the calculator 152. The storage unit 154 stores the threshold set by the setting unit 153.

The comparator 155 compares the light reception amount data obtained by the light receiving unit 104 with the threshold stored into the storage unit 154, to judge whether the object is present or absent. The output unit 108 outputs a result of the judgment to the PLC 201.

Change in Light Reception Amount During Light-On-Mode Time (Reference Example)

Figure 6A:
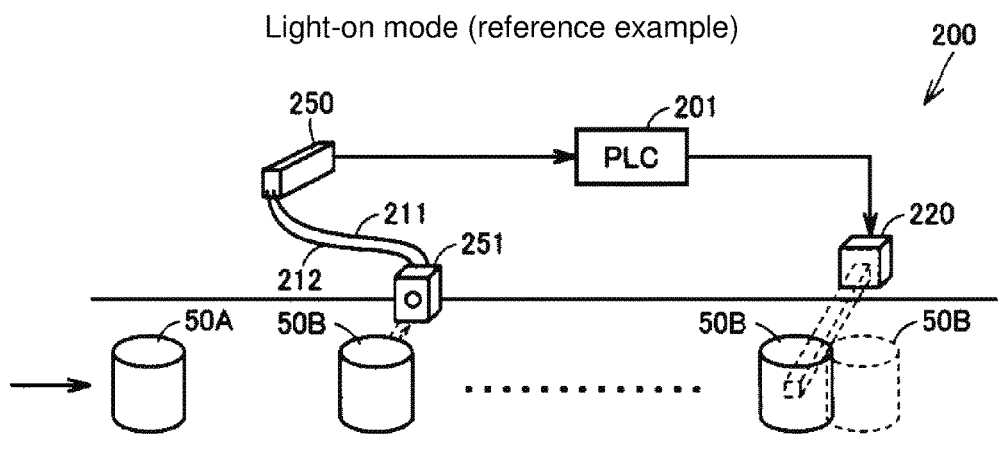
FIGS. 6A and 6B are a view and a diagram illustrating a change in a light reception amount when a photoelectric sensor according to a reference example is in a light-on mode.
Figure 6B:
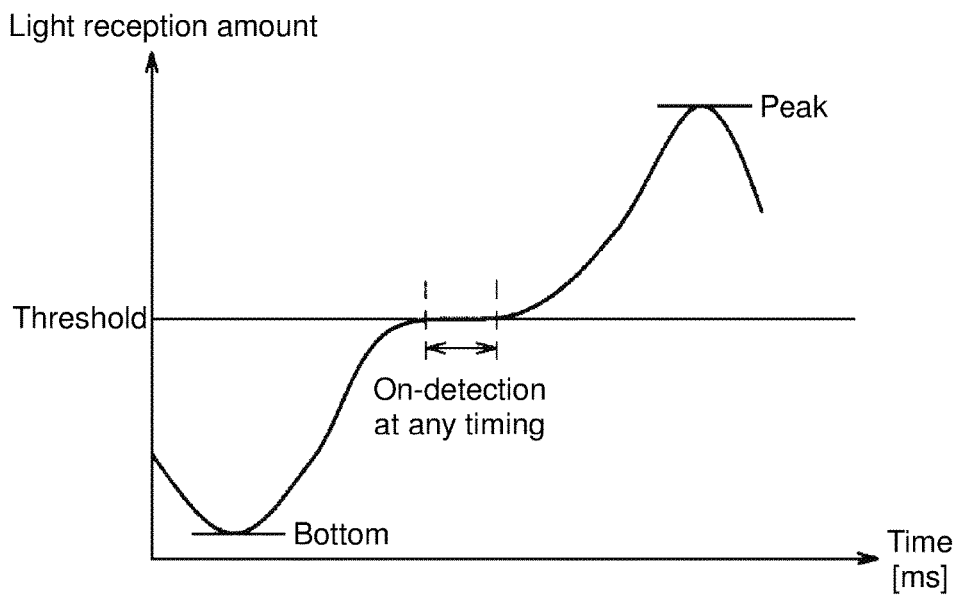

FIGS. 6A and 6B are a view and a diagram for describing a change in a light reception amount when a photoelectric sensor 250 according to a reference example is in the light-on mode.

FIG. 6A illustrates a situation where the photoelectric sensor 250 is detecting an object 50 in the light-on mode in a manufacturing line system 200. As illustrated in FIG. 6A, the manufacturing line system 200 includes the photoelectric sensor 250, the PLC 201, and a label marking device 220. The photoelectric sensor 250 and the label marking device 220 are each connected to the PLC 201. The manufacturing line system 200 is a system in which the label marking device 220 marks a label by a laser beam on the object 50 flowing on a belt conveyor.

In the light-on mode, a light-projecting optical fiber 211 and a light-receiving optical fiber 212 are connected to a jig 251. Light from the light-projecting optical fiber 211 is emitted to the detection area via the jig 251.

In a state where the object 50 has not been detected, since the light from the optical fiber 211 is not reflected on the object 50, the light-receiving optical fiber 212 does not receive reflected light via the jig 251. That is, the light reception amount of the light received by the optical fiber 212 in the case of absence of the object 50 is the minimum light reception amount.

Meanwhile, when the object 50 enters the detection area, the light from the optical fiber 211 is reflected on the object 50, and the light-receiving optical fiber 212 receives the light via the jig 251. The light reception amount of the light received by the optical fiber 212 begins to increase gradually as the object 50 begins to enter the detection area, and then reaches the maximum light reception amount.

The photoelectric sensor 250 detects the object 50 when the light reception amount of the light received by the optical fiber 212 becomes larger than the threshold (when an absolute value of the light reception amount becomes larger than the threshold). When detecting the object 50, the photoelectric sensor 250 outputs a detection signal indicating a result of the detection to the PLC 201 (i.e., the output from the photoelectric sensor 250 to the PLC 201 comes into the on-state).

When receiving the detection signal from the photoelectric sensor 250, the PLC 201 outputs a control signal to the label marking device 220. The label marking device 220 marks the label on the object 50 by a laser beam based on the control signal from the PLC 201.

For example, in an example illustrated in FIG. 6A, the optical fiber 212 receives light reflected by an object 50B, and the photoelectric sensor 250 detects the object 50B. The object 50B detected by the photoelectric sensor 250 then moves to the vicinity of the label marking device 220.

When the accuracy is high in the position where the photoelectric sensor 250 has detected the object 50B, the label marking device 220 marks the label on the object 50B at the time of the object 50B moving to the front of the label marking device 220 (cf. an example of the object 50B represented by a solid line in FIG. 6A). On the other hand, when the accuracy is low in the position where the photoelectric sensor 250 has detected the object 50B, the label marking device 220 is not activated at the time of the object 50B moving to the front of the label marking device 220, but, for example, the label marking device 220 is activated after the object 50B has passed the label marking device 220 (cf. an example of the object 50B represented by a dotted line in FIG. 6A).

As the reference example, a description will be given of a case where in the manufacturing line system 200 as above, the photoelectric sensor 250 sets as the threshold the intermediate value between the maximum light reception amount and the minimum light reception amount. For example, FIG. 6B illustrates a graph representing a change in the light reception amount when the photoelectric sensor 250 is in the light-on mode. In the graph illustrated in FIG. 6B, a horizontal axis denotes a time axis, and a vertical axis denotes a light reception amount. The graph represents a situation where the light reception amount changes with movement of the object 50.

As illustrated in FIG. 6B, when the object 50 is located the farthest from light of the optical fiber 211, the object 50 does not reflect the light of the optical fiber 211, and hence the optical fiber 212 obtains the minimum light reception amount. Such a position in the graph where the light reception amount is the minimum is referred to as a bottom. On the other hand, when the object 50 is located the nearest from the light of the optical fiber 211, the object 50 reflects the largest light amount of the optical fiber 211, and hence the optical fiber 212 obtains the maximum light reception amount. Such a position in the graph where the light reception amount is the maximum is referred to as a peak.

In the photoelectric sensor 250 according to the reference example, the intermediate value between the peak being the maximum light reception amount and the bottom being the minimum light reception amount is set as the threshold. In such a case, when the change in the light reception amount is gentle in the vicinity of the threshold as illustrated in FIG.

6B, decision that the object 50 has been detected may be made at any timing when the light reception amount becomes equal to the threshold, which widens the range for the decision to some extent. For this reason, in the photoelectric sensor 250, the timing for outputting the detection signal tends to vary, resulting in low accuracy in detection of the object by comparison between the light reception amount and the threshold.

Therefore, when the timing for detecting the object 50 varies regardless of a constant movement speed of the object 50, there occur variations in the timing for outputting the detection signal from the photoelectric sensor 250 to the PLC 201 (hereinafter, such an event is also referred to as jitter of the detection signal). When such jitter of the detection signal is brought about, the position of the object 50B deviates from the activating position of the label marking device 220, as illustrated in the example of the object 50B indicated by the dotted line in FIG. 6A.

Especially in the case of using light as a medium such as in the photoelectric sensor, as compared with the case of using sound or the like as a medium, the jitter of the detection signal can be minimized, but this requires the sensor to have high accuracy. Accordingly, when the timing for detecting the object 50 varies even a little, the quality of the object 50 tends to deteriorate at the time of manufacturing.

Therefore, the photoelectric sensor 1 according to an embodiment sets the threshold with the change in the light reception amount taken into account. Specifically, the photoelectric sensor 1 according to an embodiment first calculates a variation in the light reception amount per unit time based on the light reception amount of light received by the light receiving unit 104. The photoelectric sensor 1 then sets as the threshold a light reception amount corresponding to the variation in the light reception amount per unit time when the variation in the light reception amount satisfies a predetermined condition. Hereinafter, the setting for the threshold of the photoelectric sensor 1 according to an embodiment will be described with reference to FIGS. 7A and 7B.

Change in Light Reception Amount During Light-On-Mode Time (Embodiment)

Figure 7A:
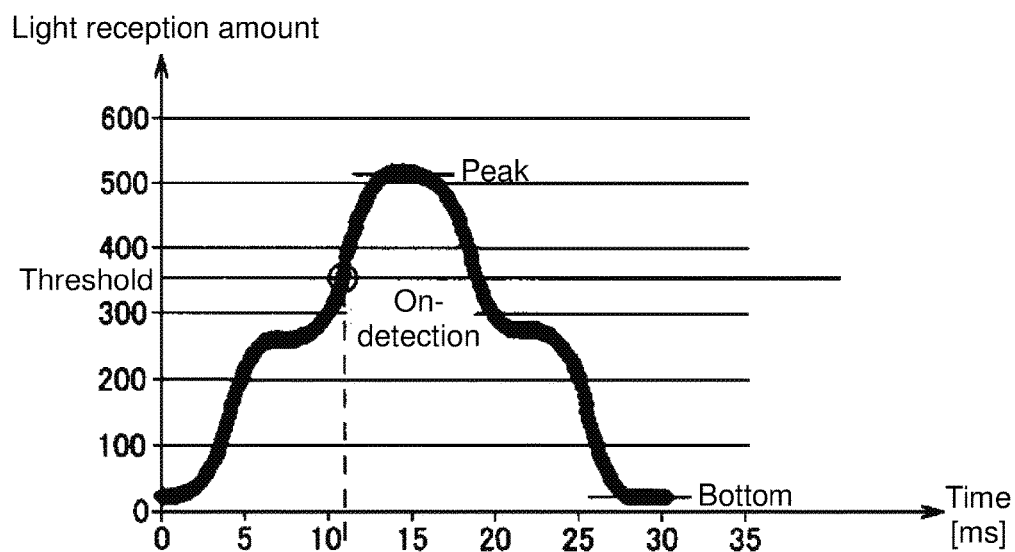
FIGS. 7A and 7B are diagrams illustrating a change in a light reception amount when a photoelectric sensor according to an embodiment is in a light-on mode.
Figure 7B:
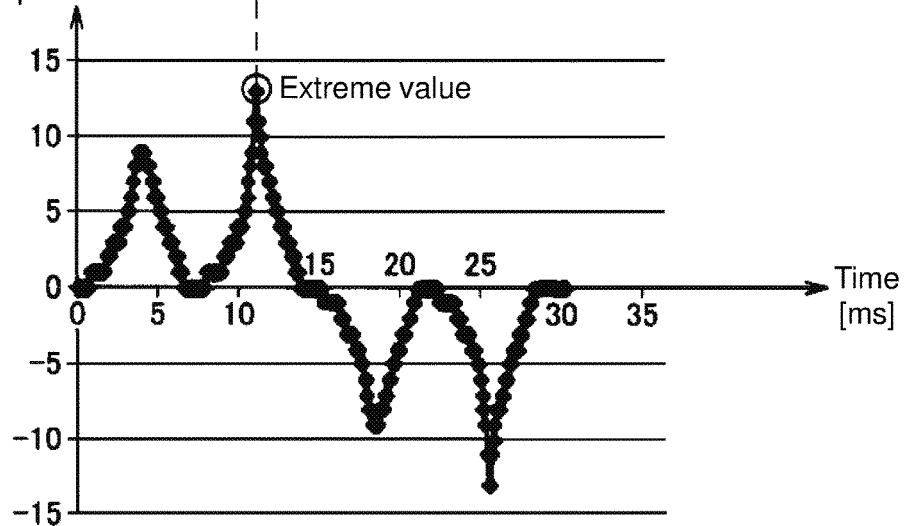

FIGS. 7A and 7B are diagrams for describing a change in a light reception amount when the photoelectric sensor 1 according to an embodiment is in the light-on mode. FIG. 7A illustrates a graph representing a change in the light reception amount when the photoelectric sensor 1 is in the light-on mode. In the graph illustrated in FIG. 7A, a horizontal axis denotes a time axis, and a vertical axis denotes a light reception amount. The graph represents a situation where the light reception amount changes with movement of the object 50. FIG. 7B illustrates a graph representing a variation in the light reception amount per unit time so as to correspond to the graph representing the change in the light reception amount illustrated in FIG. 7A. In the graph illustrated in FIG. 7B, a horizontal axis denotes a time axis, and a vertical axis denotes a variation in the light reception amount. Note that the variation in the light reception amount per unit time is a value obtained by differentiating the light reception amount represented in FIG. 7A with respect to time.

At an extreme value where the variation in the light reception amount is the maximum as illustrated in FIG. 7B, the change in the light reception amount is steep as illustrated in FIG. 7A. Then, in the photoelectric sensor 1 according to an embodiment, a light reception amount corresponding to the variation in the light reception amount being the extreme value is set as the threshold. When the threshold is set in such a manner, the change in the light reception amount in the vicinity of the threshold is steep, to narrow the range in which the light reception amount is equal to the threshold. For this reason, in the photoelectric sensor 1, the timing for outputting the detection signal does not vary, resulting in high accuracy in detection of the object 50 by comparison between the light reception amount and the threshold.

Change in Light Reception Amount During Dark-On-Mode Time (Reference Example)

Figure 8A:
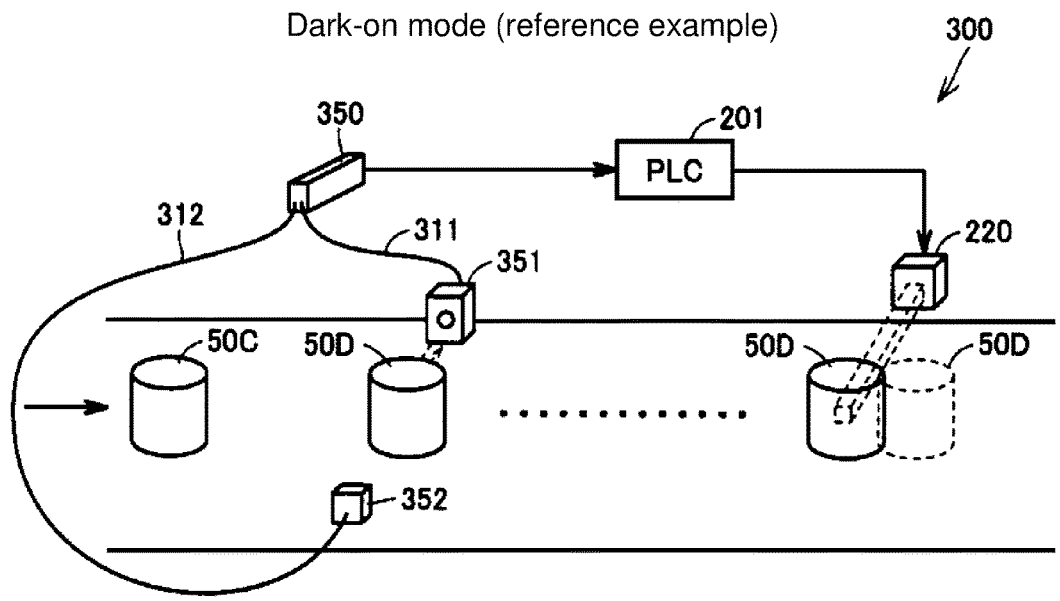
FIGS. 8A and 8B are a view and a diagram illustrating a change in a light reception amount when the photoelectric sensor according to the reference example is in a dark-on mode.
Figure 8B:
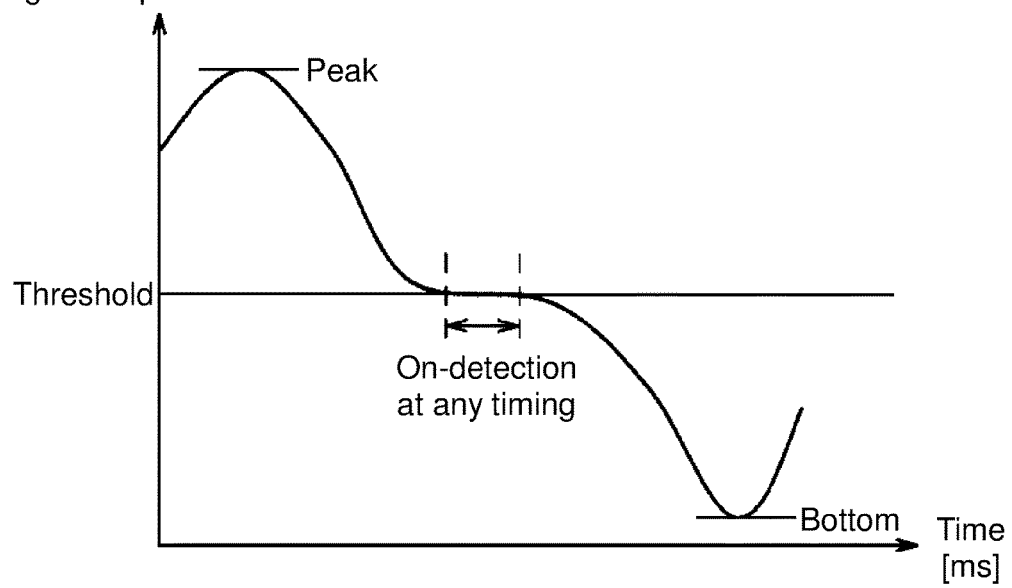

FIGS. 8A and 8B are a view and a diagram for describing a change in a light reception amount when a photoelectric sensor 350 according to a reference example is in the dark-on mode.

FIG. 8A illustrates a situation where the photoelectric sensor 350 is detecting the object 50 in the dark-on mode in a manufacturing line system 300. As illustrated in FIG. 8A, the manufacturing line system 300 includes the photoelectric sensor 350, the PLC 201, and the label marking device 220. The photoelectric sensor 350 and the label marking device 220 are each connected to the PLC 201. The manufacturing line system 300 is a system in which the label marking device 220 marks a label by a laser beam on the object 50 flowing on the belt conveyor.

In the dark-on mode, a light-projecting optical fiber 311 is connected to a jig 351, and a light-receiving optical fiber 312 is connected to a jig 352. Light from the light-projecting optical fiber 311 is emitted to the detection area via the jig 351.

In a state where the object 50 has not been detected, since light from the optical fiber 311 is not reflected on the object 50, the light-receiving optical fiber 312 receives the light via the jig 352. That is, the light reception amount of the light received by the optical fiber 312 in the case of absence of the object 50 is the maximum light reception amount.

Meanwhile, when the object 50 enters the detection area, since the light from the optical fiber 311 is reflected on the object 50, the light-receiving optical fiber 312 does not receive the light via the jig 352. The light reception amount of the light received by the optical fiber 312 begins to decrease gradually as the object 50 begins to enter the detection area, and then reaches the minimum light reception amount.

The photoelectric sensor 350 detects the object when the light reception amount of the light received by the optical fiber 312 becomes smaller than the threshold (when an absolute value of the light reception amount becomes smaller than the threshold). When detecting the object 50, the photoelectric sensor 350 outputs a detection signal indicating a result of the detection to the PLC 201 (i.e., the output from the photoelectric sensor 350 to the PLC 201 comes into the on-state).

When receiving the detection signal from the photoelectric sensor 350, the PLC 201 outputs a control signal to the label marking device 220. The label marking device 220 marks the label on the object 50 by a laser beam based on the control signal from the PLC 201.

For example, in an example illustrated in FIG. 8A, since the light from the optical fiber 311 is reflected by an object 50D, the optical fiber 312 does not receive the light, and the photoelectric sensor 350 detects the object 50D. The object 50D detected by the photoelectric sensor 350 then moves to the vicinity of the label marking device 220.

When the accuracy is high in the position where the photoelectric sensor 350 has detected the object 50D, the label marking device 220 marks the label on the object 50D at the time of the object 50D moving to the front of the label marking device 220 (cf. an example of the object 50D represented by a solid line in FIG. 8A). On the other hand, when the accuracy is low in the position where the photoelectric sensor 350 has detected the object 50D, the label marking device 220 is not activated at the time of the object 50D moving to the front of the label marking device 220, but, for example, the label marking device 220 is activated after the object 50D has passed the label marking device 220 (cf. an example of the object 50D represented by a dotted line in FIG. 8A).

As the reference example, a description will be given of a case where in the manufacturing line system 300 as above, the photoelectric sensor 350 sets as the threshold the intermediate value between the maximum light reception amount and the minimum light reception amount. For example, FIG. 8B illustrates a graph representing a change in the light reception amount when the photoelectric sensor 350 is in the dark-on mode. In the graph illustrated in FIG. 8B, a horizontal axis denotes a time axis, and a vertical axis denotes a light reception amount. The graph represents a situation where the light reception amount changes with movement of the object 50.

As illustrated in FIG. 8B, when the object 50 is located the farthest from light of the optical fiber 311, the object 50 does not reflect the light of the optical fiber 311, and hence the optical fiber 312 obtains the maximum light reception amount. Such a position in the graph where the light reception amount is the maximum is referred to as a peak. On the other hand, when the object 50 is located the nearest from the light of the optical fiber 311, the object 50 reflects the light of the optical fiber 311 most, and hence the optical fiber 312 obtains the minimum light reception amount. Such a position in the graph where the light reception amount is the minimum is referred to as a bottom.

In the photoelectric sensor 350 according to the reference example, the intermediate value between the peak being the maximum light reception amount and the bottom being the minimum light reception amount is set as the threshold. In such a case, when the change in the light reception amount is gentle in the vicinity of the threshold as illustrated in FIG. 8B, decision that the object 50 has been detected may be made at any timing when the light reception amount is equal to the threshold, which widens the range for the decision to some extent. For this reason, in the photoelectric sensor 350, the timing for outputting the detection signal tends to vary, resulting in low accuracy in detection of the object by comparison between the light reception amount and the threshold.

Therefore, regardless of a constant movement speed of the object 50, there occur variations in the timing for detecting the object 50 (jitter of the detection signal). When such jitter of the detection signal is brought about, the position of the object 50D deviates from the activating position of the label marking device 220, as illustrated in the example of the object 50D indicated by the dotted line in FIG. 8A.

Therefore, the photoelectric sensor 1 according to an embodiment sets the threshold with the change in the light reception amount taken into account. Specifically, the photoelectric sensor 1 according to an embodiment first calculates a variation in the light reception amount per unit time based on the light reception amount of light received by the light receiving unit 104. The photoelectric sensor 1 then sets as the threshold a light reception amount corresponding to the variation in the light reception amount per unit time when the variation in the light reception amount satisfies a predetermined condition. Hereinafter, the setting for the threshold of the photoelectric sensor 1 according to an embodiment will be described with reference to FIGS. 9A and 9B.

Change in Light Reception Amount During Dark-On-Mode Time (Embodiment)

Figure 9A:
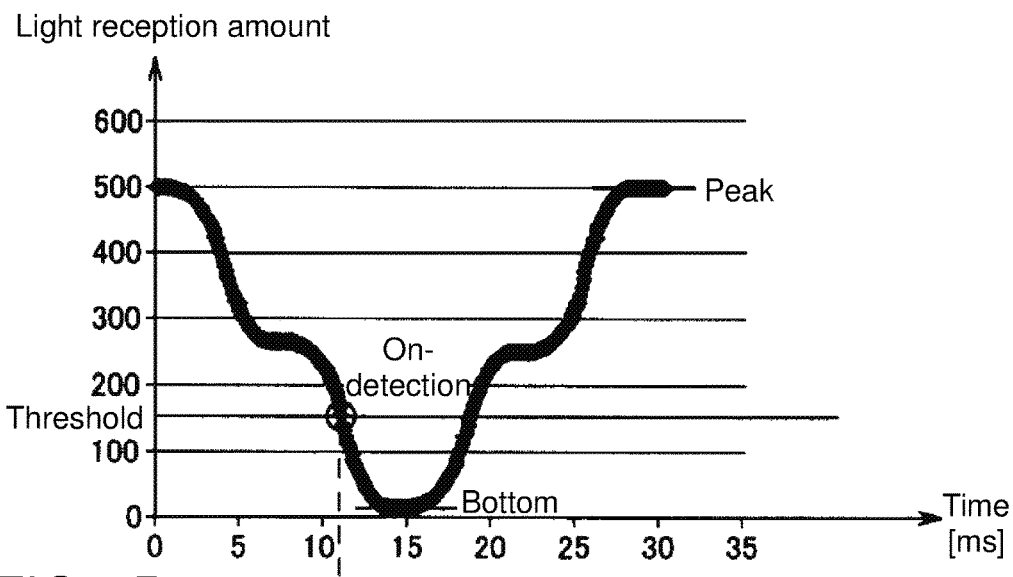
FIGS. 9A and 9B are diagrams illustrating a change in a light reception amount when a photoelectric sensor according to an embodiment is in a dark-on mode.
Figure 9B:
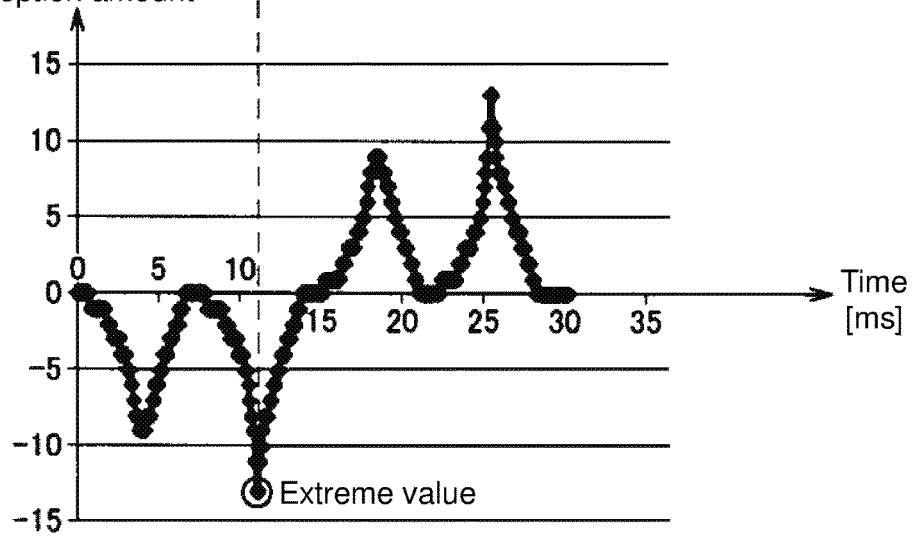

FIGS. 9A and 9B are diagrams for describing a change in a light reception amount when the photoelectric sensor 1 according to an embodiment is in the dark-on mode. FIG. 9A illustrates a graph representing a change in the light reception amount when the photoelectric sensor 1 is in the dark-on mode. In the graph illustrated in FIG. 9A, a horizontal axis denotes a time axis, and a vertical axis denotes a light reception amount. The graph represents a situation where the light reception amount changes with movement of the object 50. FIG. 9B illustrates a graph representing a variation in the light reception amount per unit time so as to correspond to the graph representing the change in the light reception amount illustrated in FIG. 9A. In the graph illustrated in FIG. 9B, a horizontal axis denotes a time axis, and a vertical axis denotes a variation in the light reception amount. Note that the variation in the light reception amount per unit time is a value obtained by differentiating the light reception amount represented in FIG. 9A with respect to time.

At an extreme value where the variation in the light reception amount is the minimum as illustrated in FIG. 9B, the change in the light reception amount is steep as illustrated in FIG. 9A. Then, in the photoelectric sensor 1 according to an embodiment, a light reception amount corresponding to the variation in the light reception amount being the extreme value is set as the threshold. When the threshold is set in such a manner, the change in the light reception amount in the vicinity of the threshold is steep, to narrow the range in which the light reception amount is equal to the threshold. For this reason, in the photoelectric sensor 1, the timing for outputting the detection signal does not vary, resulting in high accuracy in detection of the object 50 by comparison between the light reception amount and the threshold.

Tuning Processing

Figure 10:
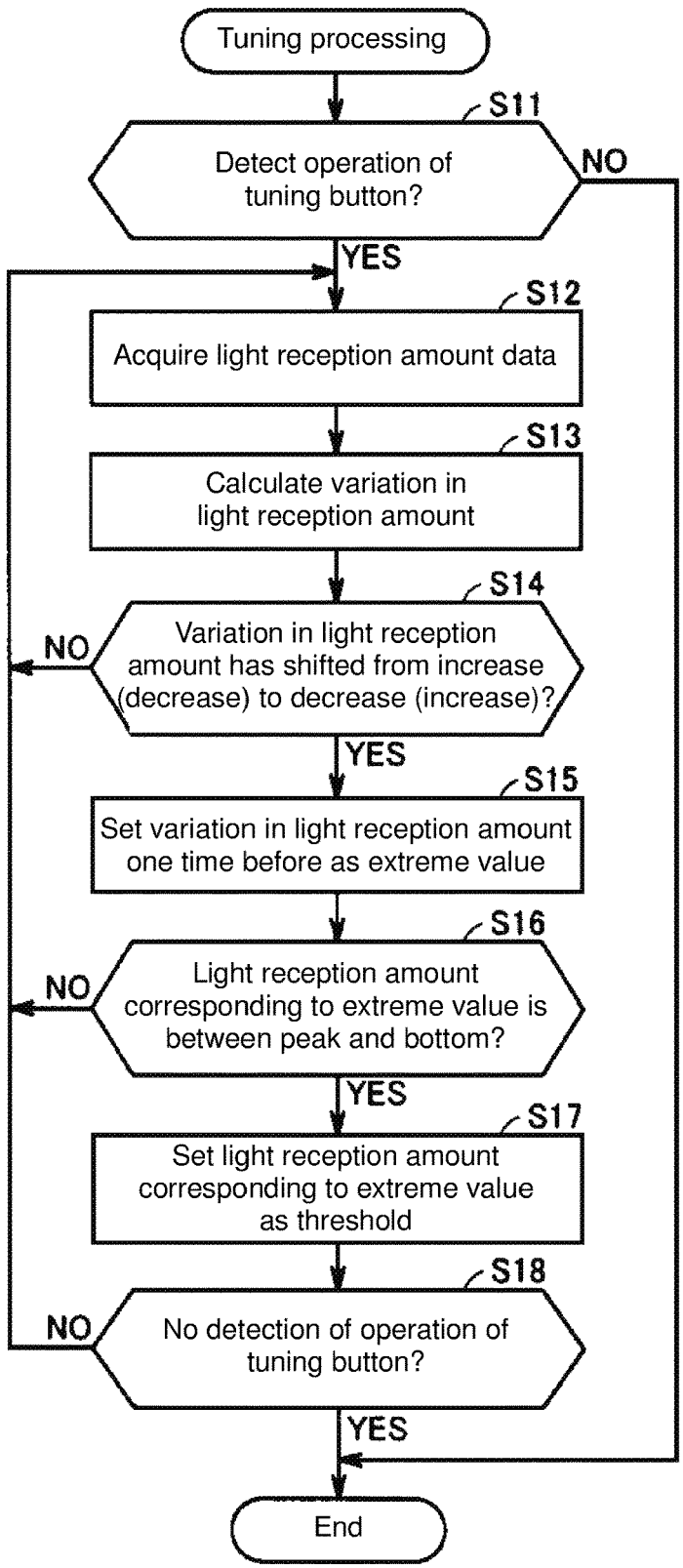
FIG. 10 is a flowchart illustrating tuning processing that is executed by a controller of a photoelectric sensor according to an embodiment.

FIG. 10 is a flowchart for describing tuning processing that is executed by the controller 105 of the photoelectric sensor 1 according to an embodiment. The controller 105 executes the tuning processing to set the threshold. Although each step (hereinafter referred to as S) of the flowchart illustrated in FIG. 10 is achieved by each of the processing units included in the controller 105, each of these processing units may be obtained by giving a shape to software processing, or may be hardware (an electronic circuit) produced in the controller 105. This also applied to each flowchart illustrated in FIGS. 11, 12, 14, and 16 described later.

As illustrated in FIG. 10, the controller 105 decides whether or not operation of the tuning button has been detected (S11). When the operation of the tuning button has not been detected (NO in S11), the controller 105 ends the tuning processing. On the other hand, when detecting the operation of the tuning button (YES in S11), the controller 105 acquires light reception amount data (S12).

The controller 105 differentiates the light reception amount with respect to time based on the acquired light reception amount data, to calculate a variation in the light reception amount per unit time (S13). The controller 105 decides whether or not the variation in the light reception amount satisfies a predetermined condition. Specifically, the controller 105 decides whether or not the variation in the light reception amount has shifted from the increase to the decrease during the light-on-mode time (S14). Further, the controller 105 decides whether or not the variation in the light reception amount has shifted from the decrease to the increase during the dark-on-mode time (S14). By executing the processing of S14 in this manner, the controller 105 decides whether or not the variation in the light reception amount is the extreme value, the variation being acquired by sampling one time before sampling of the variation in the light reception amount being the decision target in S14. When the variation in the light reception amount acquired by the sampling one time before is the extreme value, the controller 105 determines that the variation in the light reception amount satisfies the predetermined condition.

When the variation in the light reception amount does not satisfy the predetermined condition, namely when the variation in the light reception amount is not the extreme value (NO in S14), the controller 105 executes the processing of S12 again. On the other hand, when the variation in the light reception amount satisfies the predetermined condition, namely when the variation in the light reception amount is the extreme value (YES in S14), the controller 105 sets as the extreme value the above-mentioned variation in the light reception amount in the sampling one time before (S15).

The controller 105 decides whether or not the light reception amount corresponding to the set extreme value is present between the peak and the bottom (S16). When the light reception amount corresponding to the extreme value is not present between the peak and the bottom (NO in S16), the controller 105 executes the processing of S12 again. On the other hand, when the light reception amount corresponding to the extreme value is present between the peak and the bottom (YES in S16), the controller 105 sets as the threshold the light reception amount corresponding to the extreme value (S17).

The controller 105 determines whether or not the operation of the tuning button is no longer detected (S18). When still detecting the operation of the tuning button (NO in S18), the controller 105 executes the processing of S12 again. On the other hand, when the operation of the tuning button is no longer detected (YES in S18), the controller 105 ends the tuning processing.

In place of the processing of S14 and S15, the photoelectric sensor 1 may decide whether or not the variation in the light reception amount calculated in the processing of S13 is larger than the variation in the light reception amount acquired so far in the tuning processing. When deciding that it is larger, the photoelectric sensor 1 may determine that the variation in the light reception amount satisfies the predetermined condition, and set as the extreme value the variation in the light reception amount calculated in the processing of S13.

Detection Processing

Figure 11:
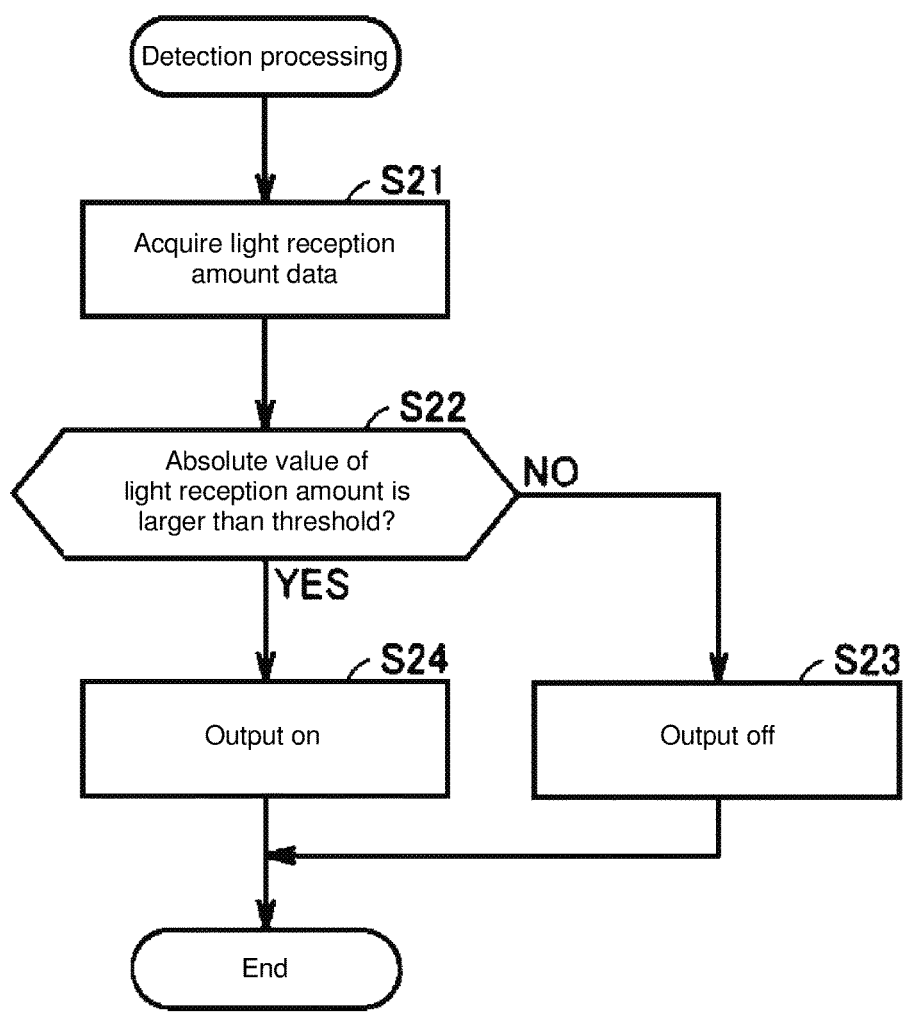
FIG. 11 is a flowchart illustrating detection processing that is executed by a controller of a photoelectric sensor according to an embodiment.

FIG. 11 is a flowchart for describing the detection processing that is executed by the controller 105 of the photoelectric sensor 1 according to an embodiment. By executing the detection processing, the controller 105 detects the object based on a result of comparison between the light reception amount and the previously set threshold.

As illustrated in FIG. 11, the controller 105 acquires light reception amount data (S21). The controller 105 decides whether or not an absolute value of the acquired light reception amount is larger than the threshold set in the tuning processing (S22).

When the absolute value of the light reception amount is not larger than the threshold (NO in S22), the controller 105 brings the output to the PLC 201 into the off-state (S23) and ends the detection processing. On the other hand, when the absolute value of the light reception amount is larger than the threshold (YES in S22), the controller 105 brings the output to the PLC 201 into the on-state (S24) and ends the detection processing.

As described above, the photoelectric sensor 1 according to an embodiment sets as a threshold a light reception amount corresponding to the variation in the light reception amount per unit time when the variation in the light reception amount per unit time satisfies a predetermined condition. Further, the method for setting the threshold of the photoelectric sensor 1 according to an embodiment includes the step of setting a light reception amount corresponding to the variation in the light reception amount per unit time when the variation in the light reception amount per unit time satisfies a predetermined condition. Specifically, when the variation in the light reception amount is the extreme value (when decided YES in S14 of FIG. 10), the photoelectric sensor 1 according to an embodiment sets as the threshold the light reception amount corresponding to the extreme value (S17 of FIG. 10). In this manner, the threshold is set with the variation in the light reception amount per unit time taken into account, thereby enhancing the accuracy in detection of the object by comparison between the light reception amount and the threshold. It is thereby possible to minimize the jitter of the detection signal from the photoelectric sensor 1 to the PLC 201.

The controller 105 (sampling unit 151) of the photoelectric sensor 1 according to an embodiment samples the light reception amount, obtained by the light receiving unit 104, with a constant period (e.g. a period of 0.1 seconds). Hence the variation in the light reception amount per unit time can be easily calculated based on the sampled light reception amount.

Modified Examples

While an embodiment has been described above, the configuration according to an embodiment is not restricted to the above, but can be subjected to a variety of modification and applications. Hereinafter, modified examples applicable to an embodiment will be described.

(Photoelectric Sensor According to First Modified Example)

A photoelectric sensor according to a first modified example will be described. The photoelectric sensor according to the first modified example is provided with a configuration similar to that provided in the photoelectric sensor 1 according to an embodiment, except for a configuration described below.

Figure 12:
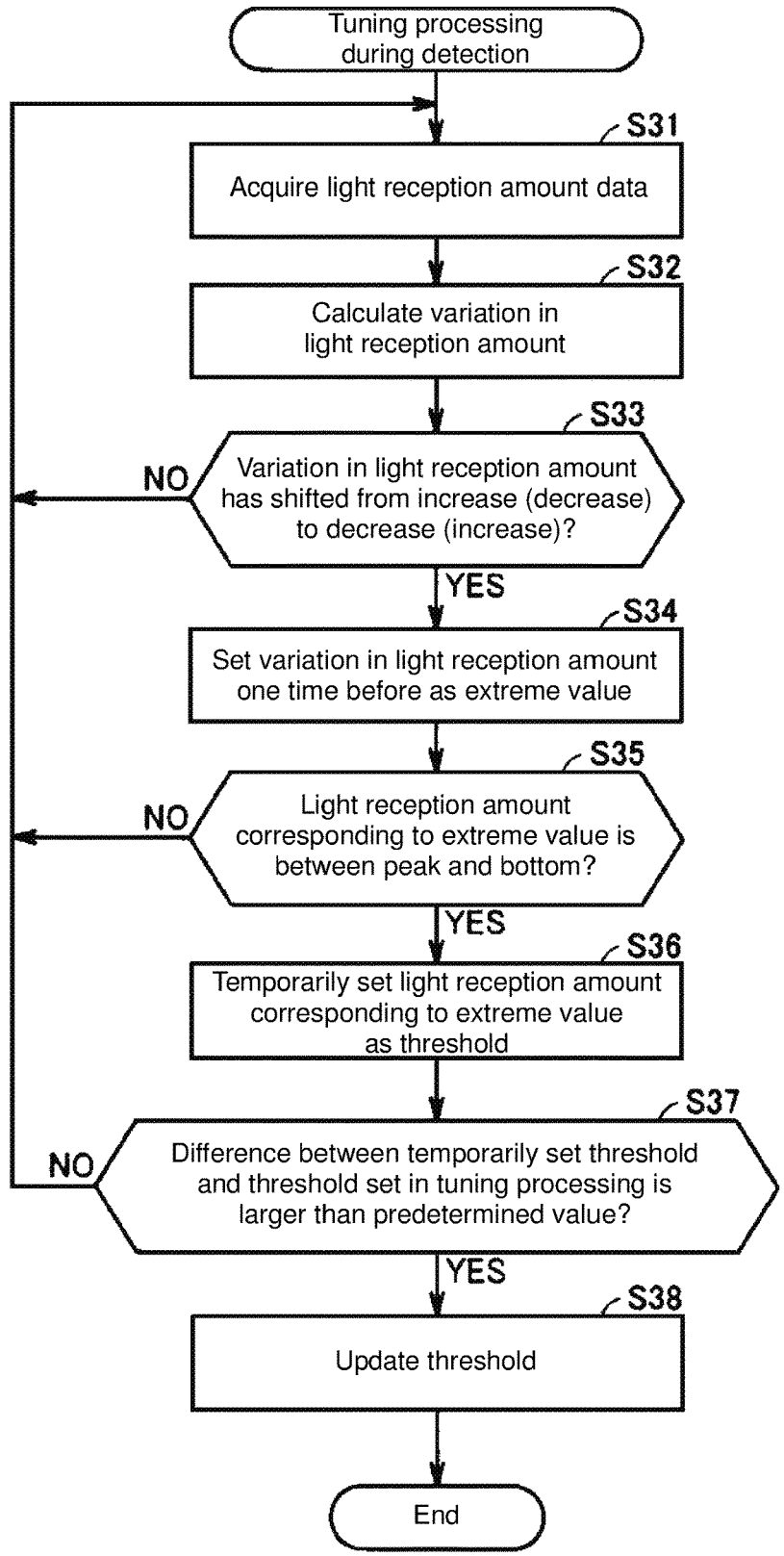
FIG. 12 is a flowchart illustrating tuning processing during detection that is executed by a controller of a photoelectric sensor according to a first modified example.

FIG. 12 is a flowchart for describing tuning processing during detection which is executed by a controller of the photoelectric sensor according to the first modified example. By executing the tuning processing during detection, the photoelectric sensor according to the first modified example can update the threshold at any time even during detection of the object. The photoelectric sensor according to the first modified example executes the tuning processing during detection illustrated in FIG. 12 in parallel to the detection processing illustrated in FIG. 11.

As illustrated in FIG. 12, the controller acquires light reception amount data (S31). The controller differentiates the light reception amount with respect to time based on the acquired light reception amount data, to calculate a variation in the light reception amount per unit time (S32). The controller decides whether or not the variation in the light reception amount satisfies a predetermined condition. Specifically, the controller decides whether or not the variation in the light reception amount has shifted from the increase to the decrease during the light-on-mode time (S33). Further, the controller decides whether or not the variation in the light reception amount has shifted from the decrease to the increase during the dark-on-mode time (S33). By executing the processing of S33 in this manner, the controller decides whether or not the variation in the light reception amount is the extreme value, the variation being acquired by sampling one time before sampling of the variation in the light reception amount being the decision target in S33. When the variation in the light reception amount acquired by the sampling one time before is the extreme value, the controller determines that the variation in the light reception amount satisfies the predetermined condition.

When the variation in the light reception amount does not satisfy the predetermined condition, namely when the variation in the light reception amount is not the extreme value (NO in S33), the controller executes the processing of S31 again. On the other hand, when the variation in the light reception amount satisfies the predetermined condition, namely when the variation in the light reception amount is the extreme value (YES in S33), the controller sets as the extreme value the above-mentioned variation in the light reception amount in the sampling one time before (S34).

The controller decides whether or not the light reception amount corresponding to the set extreme value is present between the peak and the bottom (S35). When the light reception amount corresponding to the extreme value is not present between the peak and the bottom (NO in S35), the controller executes the processing of S31 again. On the other hand, when the light reception amount corresponding to the extreme value is present between the peak and the bottom (YES in S35), the controller temporarily sets as the threshold the light reception amount corresponding to the extreme value (S36).

The controller decides whether or not a difference between the temporarily set threshold and the threshold set in the tuning processing is larger than a predetermined value (S37). While the predetermined value is freely settable, it is set at a value with which the jitter of the detection signal from the photoelectric sensor according to the first modified example to the PLC 201 is within a permissible range in the system where the photoelectric sensor is applied.

When the difference between the temporarily set threshold and the threshold previously set in the tuning processing is not larger than the predetermined value (NO in S37), the controller executes the processing of S31 again. On the other hand, when the difference between the temporarily set threshold and the threshold set in the tuning processing is larger than the predetermined value (YES in S37), the controller updates the threshold set in the tuning processing to the temporarily set threshold (S38) and ends the tuning processing during detection.

As described above, the photoelectric sensor according to the first modified example updates the threshold previously set in the tuning processing to a newly set threshold based on the sampled light reception amount, while executing the detection processing (S37, S38 of FIG. 12). As above, even while the detection processing is being executed, the threshold previously set in the tuning processing is updated, thereby enhancing the accuracy in detection of the object by comparison between the light reception amount and the threshold. It is thereby possible to minimize the jitter of the detection signal from the photoelectric sensor to the PLC 201.

In place of the processing of S33 and S34, the photoelectric sensor according to the first modified example may decide whether or not the variation in the light reception amount calculated in the processing of S32 is larger than the variation in the light reception amount acquired so far in the tuning processing during detection. When deciding that it is larger, the photoelectric sensor 1 may determine that the variation in the light reception amount satisfies the predetermined condition, and set as the extreme value the variation in the light reception amount calculated in the processing of S32.

(Photoelectric Sensor According to Second Modified Example)

A photoelectric sensor according to a second modified example will be described. The photoelectric sensor according to the second modified example is provided with a configuration similar to that provided in the photoelectric sensor 1 according to an embodiment, except for a configuration described below.

Figure 13A:
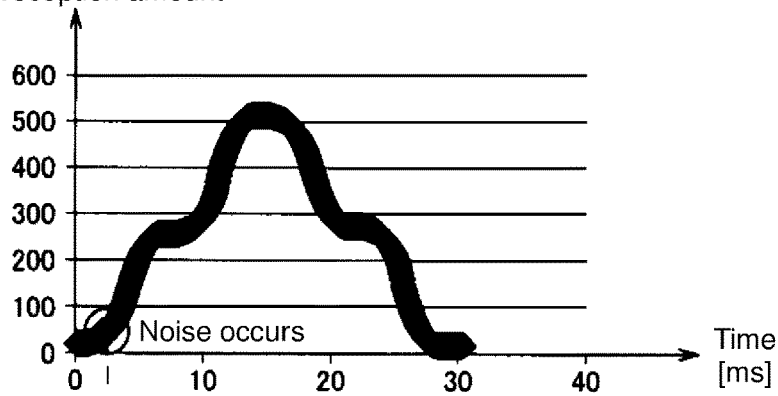
FIGS. 13A to 13C are diagrams illustrating a change in a light reception amount when a photoelectric sensor according to a second modified example is in a light-on mode.
Figure 13B:
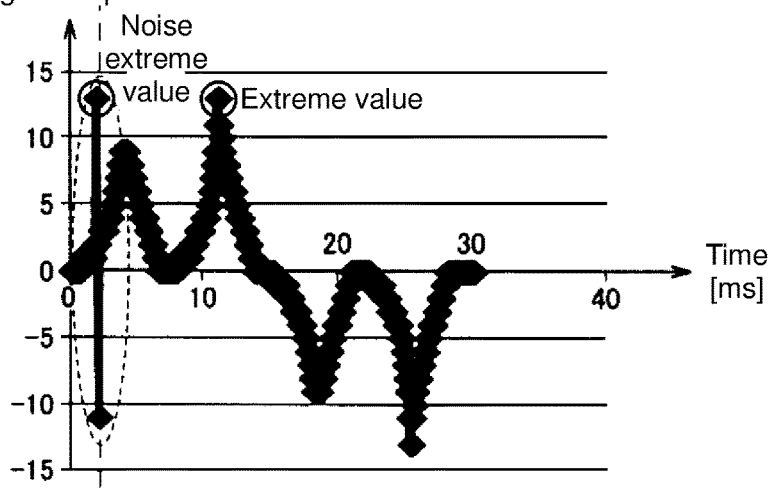
Figure 13C:
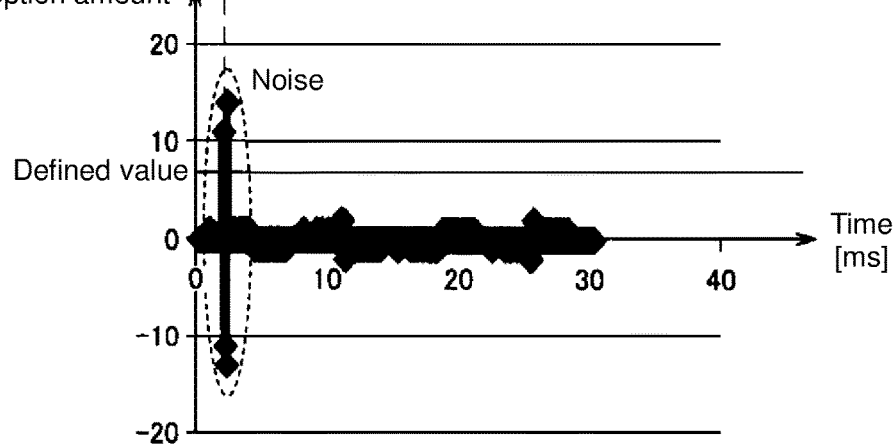

FIGS. 13A to 13C are diagrams for describing a change in a light reception amount when the photoelectric sensor according to the second modified example is in the light-on mode. In the photoelectric sensor according to the second modified example, even when the variation in the light reception amount is the extreme value, if the extreme value is obtained due to an influence of noise (e.g., impulse noise), it is excluded from being a threshold setting target.

For example, FIG. 13A illustrates a graph representing a change in the light reception amount when the photoelectric sensor according to the second modified example is in the light-on mode. In the graph illustrated in FIG. 13A, a horizontal axis denotes a time axis, and a vertical axis denotes a light reception amount. The graph represents a situation where the light reception amount changes with movement of the object. FIG. 13B illustrates a graph representing a variation in the light reception amount per unit time so as to correspond to the graph representing the change in the light reception amount illustrated in FIG. 13A. In the graph illustrated in FIG. 13B, a horizontal axis denotes a time axis, and a vertical axis denotes a variation in the light reception amount. Note that the variation in the light reception amount per unit time is a value obtained by differentiating the light reception amount represented in FIG. 13A with respect to time. FIG. 13C illustrates a graph representing a further variation per unit time of the variation in the light reception amount so as to correspond to the graph representing the variation in the light reception amount illustrated in FIG. 13B. In the graph illustrated in FIG. 13C, a horizontal axis denotes a time axis, and a vertical axis denotes a differential value of the variation in the light reception amount.

As illustrated in FIG. 13B, the extreme values of the variation in the light reception amount include an extreme value obtained when the change in the light reception amount is steep and an extreme value obtained due to the influence of noise. When the extreme value due to the influence of noise as above is present, the extreme value might be taken as the threshold setting target in the tuning processing of the photoelectric sensor 1 according to an embodiment illustrated in FIG. 10.

Therefore, as illustrated in FIG. 13C, the photoelectric sensor according to the second modified example further differentiates the variation in the light reception amount with respect to time to obtain a differential value of the variation in the light reception amount. The differential value of the variation in the light reception amount illustrated in FIG. 13C is the further variation per unit time of the variation in the light reception amount illustrated in FIG. 13B. Hence the extreme value of the differential value appears only due to the influence of noise. Accordingly, even in the case of appearance of the extreme value in the variation in the light reception amount, when an extreme value exceeding a defined value of the differential value of the variation in the light reception amount appears, the photoelectric sensor according to the second modified example determines that it has been influenced by noise, and excludes the extreme value from being the threshold setting target.

Figure 14:
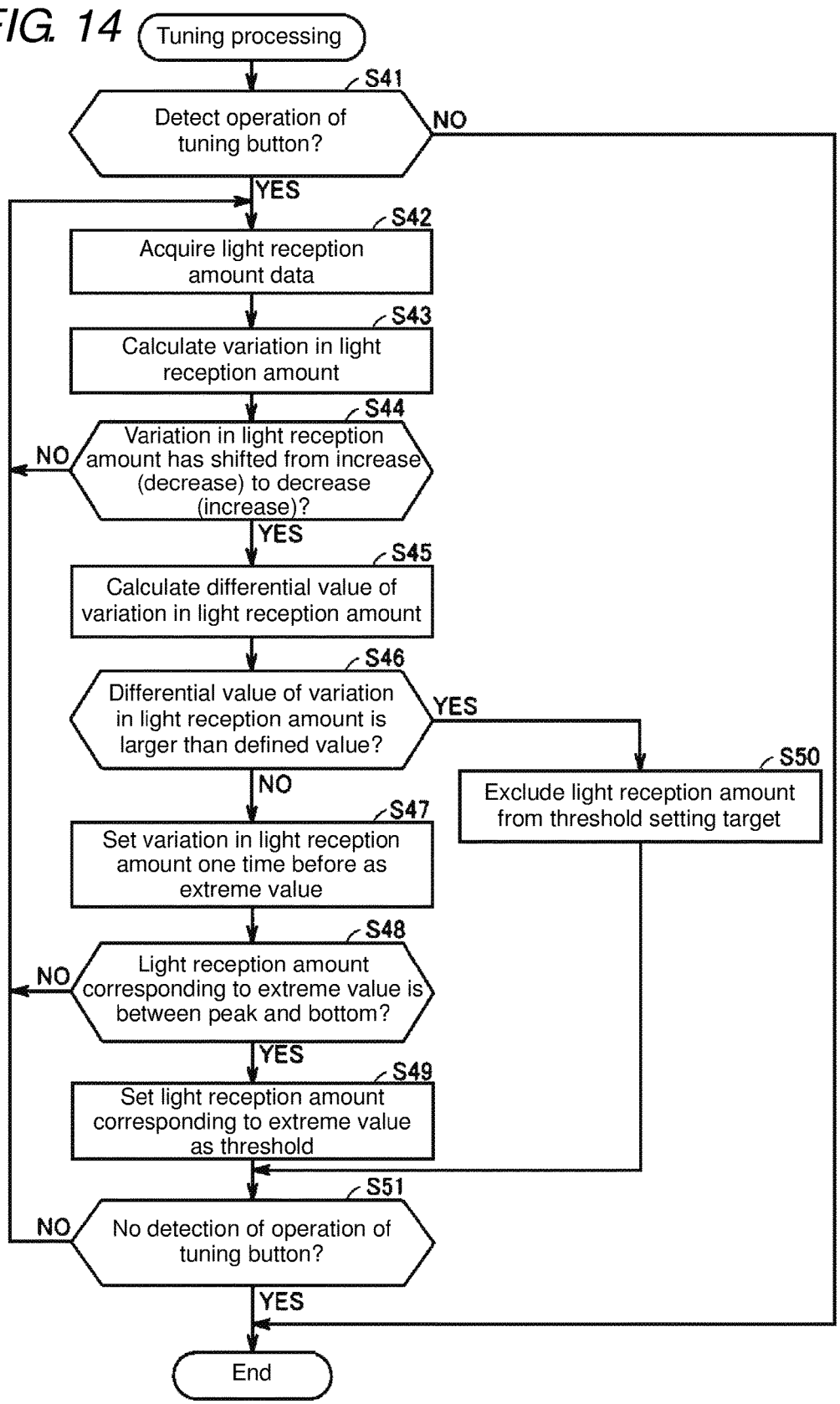
FIG. 14 is a flowchart illustrating tuning processing that is executed by a controller of a photoelectric sensor according to a second modified example.

FIG. 14 is a flowchart for describing tuning processing that is executed by a controller of the photoelectric sensor according to the second modified example.

As illustrated in FIG. 14, the controller decides whether or not to have detected the operation of the tuning button (S41). When not detecting the operation of the tuning button (NO in S41), the controller ends the tuning processing. On the other hand, when detecting the operation of the tuning button (YES in S41), the controller acquires light reception amount data (S42).

The controller differentiates the light reception amount with respect to time based on the acquired light reception amount data, to calculate a variation in the light reception amount per unit time (S43). The controller decides whether or not the variation in the light reception amount satisfies a predetermined condition. Specifically, the controller decides whether or not the variation in the light reception amount has shifted from the increase to the decrease during the light-on-mode time (S44). Further, the controller decides whether or not the variation in the light reception amount has shifted from the decrease to the increase during the dark-on-mode time (S44). By executing the processing of S44 in this manner, the controller decides whether or not the variation in the light reception amount is the extreme value, the variation being acquired by sampling one time before sampling of the variation in the light reception amount being the decision target in S44. When the variation in the light reception amount acquired by the sampling one time before is the extreme value, the controller determines that the variation in the light reception amount satisfies the predetermined condition.

When the variation in the light reception amount does not satisfy the predetermined condition, namely when the variation in the light reception amount is not the extreme value (NO in S44), the controller executes the processing of S42 again. On the other hand, when the variation in the light reception amount satisfies the predetermined condition, namely when the variation in the light reception amount is the extreme value (YES in S44), the controller further differentiates the variation in the light reception amount with respect to time based on the variations in the light reception amounts in the sampling one time before and one time after, centered at the variation in the light reception amount being the extreme value, to calculate a differential value of the variation in the light reception amount (S45).

The controller decides whether the differential value of the variation in the light reception amount is larger than the defined value (S46). While the defined value is freely settable, it is set at a value with which the jitter of the detection signal from the photoelectric sensor to the PLC 201 is within a permissible range in the system where the photoelectric sensor according to the second modified example is applied.

When the differential value of the variation in the light reception amount is not larger than the defined value (NO in S46), the controller determines that the differential value is not influenced by noise and sets as the extreme value the variation in the light reception amount in the sampling one time before (S47).

The controller decides whether or not the light reception amount corresponding to the set extreme value is present between the peak and the bottom (S48). When the light reception amount corresponding to the extreme value is not present between the peak and the bottom (NO in S48), the controller executes the processing of S42 again. On the other hand, when the light reception amount corresponding to the extreme value is present between the peak and the bottom (YES in S48), the controller sets as the threshold the light reception amount corresponding to the extreme value (S49) and executes the processing of S51.

On the other hand, when the differential value of the variation in the light reception amount is larger than the defined value (YES in S46), the controller excludes the light reception amount corresponding to the differential value of the variation in the light reception amount from being the threshold setting target (S50). For example, when the differential value of the variation in the light reception amount is larger than the defined value, the controller excludes the variation in the light reception amount in the sampling one time before from being the extreme value. Thereafter, the controller executes the processing of S51.

Note that the controller may omit the processing of S50 and executes the processing of S51 as it is when the differential value of the variation in the light reception amount is larger than the defined value (YES in S46). Even in such a flow, since the processing of S47 to S49 is not executed, the extreme value of the variation in the light reception amount due to the influence of noise can be excluded from being the threshold setting target.

The controller decides whether or not the operation of the tuning button is no longer detected (S51). When still detecting the operation of the tuning button (NO in S51), the controller executes the processing of S42 again. On the other hand, when the operation of the tuning button is no longer detected (YES in S51), the controller ends the tuning processing.

As described above, the photoelectric sensor according to the second modified example calculates the differential value of the variation in the light reception amount which is the further variation per unit time of the variation in the light reception amount per unit time (S45 of FIG. 14), and when the differential value of the variation in the light reception amount is larger than the defined value (when decided YES in S46 of FIG. 14), the photoelectric sensor excludes the light reception amount corresponding to the differential value of the variation in the light reception amount from being the threshold setting target (S50 of FIG. 14). As thus described, when the differential value of the variation in the light reception amount is larger than the defined value, it is possible that the differential value has been influenced by noise or the like. However, since the light reception amount corresponding to the differential value of the variation in the light reception amount is excluded from being the threshold setting target, the accuracy is high in detection of the object by comparison between the light reception amount and the threshold. It is thereby possible to minimize the jitter of the detection signal from the photoelectric sensor to the PLC 201.

In place of the processing of S44 and S46, the photoelectric sensor according to the second modified example may decide whether or not the variation in the light reception amount calculated in the processing of S43 is larger than the variation in the light reception amount acquired so far in the tuning processing. When deciding that it is larger, the photoelectric sensor may determine that the variation in the light reception amount satisfies the predetermined condition, and may decide in the processing of S46 as to whether or not the variation in the light reception amount calculated in the processing of S43 is larger than the defined value.

(Photoelectric Sensor According to Third Modified Example)

A photoelectric sensor according to a third modified example will be described. The photoelectric sensor according to the third modified example is provided with a configuration similar to that provided in the photoelectric sensor 1 according to an embodiment, except for a configuration described below.

Figure 15A:
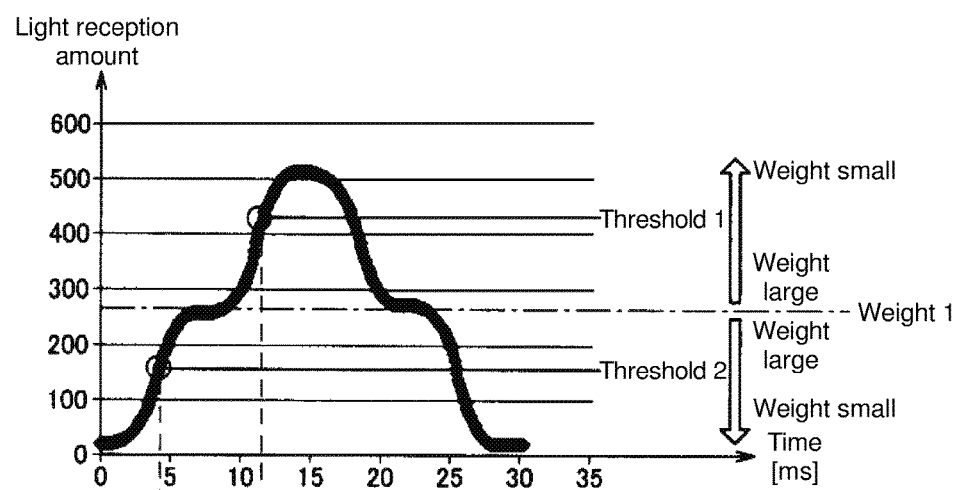
FIGS. 15A and 15B are diagrams illustrating a change in a light reception amount when a photoelectric sensor according to a third modified example is in a light-on mode.
Figure 15B:
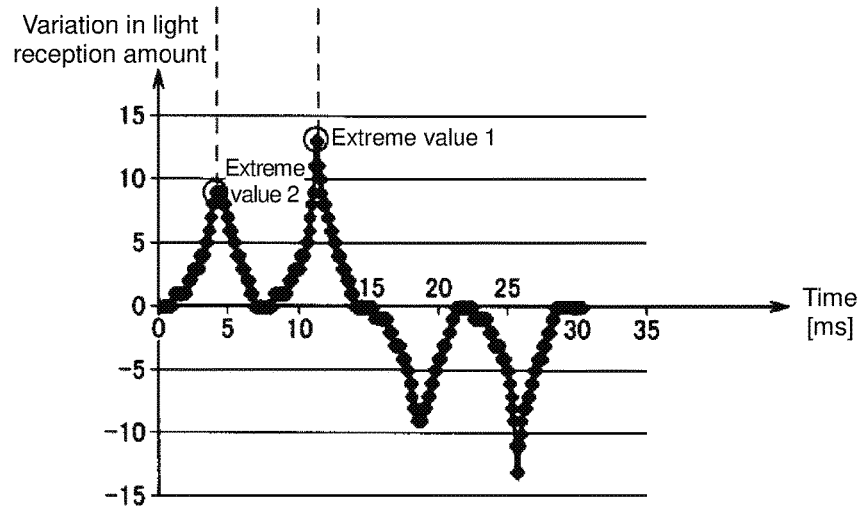

FIGS. 15A and 15B are diagrams for describing a change in the light reception amount when the photoelectric sensor according to the third modified example is in the light-on mode. When a plurality of extreme values of the variation in the light reception amount appear, the photoelectric sensor according to the third modified example sets the threshold based on a result of weighting each of the light reception amounts corresponding to the plurality of extreme values.

For example, FIG. 15A illustrates a graph representing a change in the light reception amount when the photoelectric sensor according to the third modified example is in the light-on mode. In the graph illustrated in FIG. 15A, a horizontal axis denotes a time axis, and a vertical axis denotes a light reception amount. The graph represents a situation where the light reception amount changes with movement of the object. FIG. 15B illustrates a graph representing a variation in the light reception amount per unit time so as to correspond to the graph representing the change in the light reception amount illustrated in FIG. 15A. In the graph illustrated in FIG. 15B, a horizontal axis denotes a time axis, and a vertical axis denotes a variation in the light reception amount. Note that the variation in the light reception amount per unit time is a value obtained by differentiating the light reception amount represented in FIG. 15A with respect to time.

As illustrated in FIG. 15B, an extreme value 1 and an extreme value 2 appear in the graph of the variation in the light reception amount. The variation in the light reception amount of the extreme value 1 represented in FIG. 15B is larger than that of the extreme value 2. For this reason, as illustrated in FIG. 15A, a change in the light reception amount corresponding to the extreme value 1 is steeper than a change in the light reception amount corresponding to the extreme value 2. However, a difference between the light reception amount corresponding to the extreme value 1 and the maximum light reception amount is smaller than a difference between the light reception amount corresponding to the extreme value 2 and the minimum light reception amount. For this reason, when the light reception amount corresponding to the extreme value 1 is set as the threshold, a margin (a ratio of the light reception amount to the threshold) is smaller than when the light reception amount corresponding to the extreme value 2 is set as the threshold. Thus, when the light reception amount corresponding to the extreme value 1 is set as the threshold, detection of the object might be unstable compared to when the light reception amount corresponding to the extreme value 2 is set as the threshold.

As thus described, when a plurality of extreme values appear, the stability of detection of the object might vary depending on the light reception amount corresponding to which extreme value is set as the threshold.

Accordingly, in the photoelectric sensor according to the third modified example, as illustrated in FIG. 15A, a weight of the intermediate value between the maximum light reception amount and the minimum light reception amount is set at "1", and the weight is made smaller as the light reception amount comes closer to the maximum light reception amount or comes closer to the minimum light reception amount. The photoelectric sensor then sets the threshold based on a result of weighting each of the light reception amounts corresponding to the plurality of extreme values.

For example, as illustrated in FIG. 15B, the value of the variation in the light reception amount corresponding to the extreme value 1 is larger than the value of the variation in the light reception amount corresponding to the extreme value 2. Meanwhile, as illustrated in FIG. 15A, the weight on the light reception amount corresponding to the extreme value 1 is smaller than the weight on the light reception amount corresponding to the extreme value 2. Thus, for example when each of the variation in the light reception amount corresponding to the extreme value 1 and the variation in the light reception amount corresponding to the extreme value 2 is weighted, the weighted value of the variation in the light reception amount corresponding to the extreme value 2 may be larger than the weighted value of the variation in the light reception amount corresponding to the extreme value 1. In such a case, the photoelectric sensor sets the light reception amount corresponding to the extreme value 2 as the threshold.

FIG. 16 is a flowchart for describing the tuning processing that is executed by a controller of the photoelectric sensor according to the third modified example.

As illustrated in FIG. 16, the controller determines whether or not to have detected the operation of the tuning button (S61). When not detecting the operation of the tuning button (NO in S61), the controller ends the tuning processing. On the other hand, when detecting the operation of the tuning button (YES in S61), the controller acquires light reception amount data (S62).

The controller differentiates the light reception amount with respect to time based on the acquired light reception amount data, to calculate a variation in the light reception amount per unit time (S63). The controller decides whether or not the variation in the light reception amount satisfies a predetermined condition. Specifically, the controller decides whether or not the variation in the light reception amount has shifted from the increase to the decrease during the light-on-mode time (S64). Further, the controller decides whether or not the variation in the light reception amount has shifted from the decrease to the increase during the dark-on-mode time (S64). By executing the processing of S64 in this manner, the controller decides whether or not the variation in the light reception amount is the extreme value, the variation being acquired by sampling one time before sampling of the variation in the light reception amount being the decision target in S64. When the variation in the light reception amount acquired by the sampling one time before is the extreme value, the controller determines that the variation in the light reception amount satisfies the predetermined condition.

When the variation in the light reception amount does not satisfy the predetermined condition, namely when the variation in the light reception amount is not the extreme value (NO in S64), the controller executes the processing of S62 again. On the other hand, when the variation in the light reception amount satisfies the predetermined condition, namely when the variation in the light reception amount is the extreme value (YES in S64), the controller sets as the extreme value the above-mentioned variation in the light reception amount in the sampling one time before (S65).

The controller decides whether or not a plurality of extreme values are present (S66). When a plurality of extreme values are not present (NO in S66), the controller executes the processing of S67. On the other hand, when a plurality of extreme values are present (YES in S66), the controller sets any of the extreme values by weighting each of the light reception amounts corresponding to the plurality of extreme values (S68), and executes the processing of S67.

The controller decides whether or not the light reception amount corresponding to the set extreme value is present between the peak and the bottom (S67). When the light reception amount corresponding to the extreme value is not present between the peak and the bottom (NO in S67), the controller executes the processing of S62 again. On the other hand, when the light reception amount corresponding to the extreme value is present between the peak and the bottom (YES in S67), the controller sets as the threshold the light reception amount corresponding to the extreme value (S69).

The controller decides whether or not the operation of the tuning button is no longer detected (S70). When still detecting the operation of the tuning button (NO in S70), the controller executes the processing of S62 again. On the other hand, when the operation of the tuning button is no longer detected (YES in S70), the controller ends the tuning processing.

As described above, when a plurality of extreme values appear (when decided YES in S66 of FIG. 16), the photoelectric sensor according to the third modified example sets the threshold based on a result of weighting each of the plurality of extreme values (S68 of FIG. 16). As thus described, even when a plurality of extreme values are present, the threshold is set by weighing, thus enhancing the accuracy in comparison between the light reception amount and the threshold. It is thereby possible to minimize the jitter of the detection signal from the photoelectric sensor to the PLC 201.

As for weighting, a weight on the intermediate value between the maximum light reception amount and the minimum light reception amount is not necessarily taken as "1", but a weight on the light reception amount with the largest margin (a ratio of the light reception amount to the threshold) may be taken as "1."

Other Modified Examples

The photoelectric sensors according to an embodiment and the first to third modified examples set as the threshold the maximum extreme value obtained when the variation in the light reception amount shifts from the increase to the decrease during the light-on-mode time, and the minimum extreme value obtained when the variation in the light reception amount shifts from the decrease to the increase during the dark-on-mode time. However, this is not restrictive, and the photoelectric sensor may set as the threshold the minimum extreme value obtained when the variation in the light reception amount shifts from the decrease to the increase during the light-on-mode time, and the maximum extreme value obtained when the variation in the light reception amount shifts from the increase to the decrease during the dark-on-mode time. That is, either during the light-on-mode time or during the dark-on-mode time, the photoelectric sensor may set as the threshold the light reception amount corresponding to the extreme value being the maximum absolute value of the variation in the light reception amount.

The tuning processing (the method for setting the threshold) of each of the photoelectric sensors according to an embodiment and the first to third modified examples is applicable either during the light-on-mode time or during the dark-on-mode time.

The photoelectric sensors according to an embodiment and the first to third modified examples have differentiated the light reception amount with respect to time, to calculate the variation in the light reception amount per unit time. However, this is not restrictive, and the photoelectric sensor may calculate a difference in the light reception amount per sampling to calculate the variation in the light reception amount per sampling rate, so long as the sampling is performed with a constant period.

The photoelectric sensors according to an embodiment and the first to third modified examples shift the output to the PLC 201 from the off-state to the on-state when detecting the object. However, this is not restrictive, and the photoelectric sensor may shift the output to the PLC 201 from the on-state to the off-state when detecting the object.

The photoelectric sensors according to an embodiment and the first to third modified examples set as the threshold the light reception amount corresponding to the extreme value of the variation in the light reception amount. However, this is not restrictive, and the photoelectric sensor may set as the threshold a value in the vicinity of the extreme value of the variation in the light reception amount (a value near the extreme value), in other words, the light reception amount corresponding to a specific value being a value within a predetermined range from the extreme values of the variation in the light reception amount. That is, the photoelectric sensor may determine that the variation in the light reception amount satisfies the predetermined condition when deciding that the calculated variation in the light reception amount is the specific value being the value within a predetermined range from the extreme value and set as the threshold the light reception amount corresponding to the calculated variation in the light reception amount. While the specific value is freely settable, it is set at a value with which the jitter of the detection signal from the photoelectric sensor to the PLC 201 is within a permissible range in the system where the photoelectric sensor is applied.

The photoelectric sensors according to an embodiment and the first to third modified examples set the threshold, triggered by the operation of the tuning button. However, this is not restrictive, and the photoelectric sensor may set the threshold when receiving an external input signal. Further, the photoelectric sensor may set the threshold when establishing communication with the PLC 201.

Note that the embodiments disclosed this time should be considered as being illustrative in all respects and not being restrictive. The scope of the present invention is not shown by the above description, but by the scope of the claims, and is intended to include all changes in the meaning and range equivalent to those in the scope of the claims.

The invention claimed is:

1. A sensor for detecting an object by reception of light from a light projecting unit in a light receiving unit, the sensor comprising:
   a sampling unit configured to sample a light reception amount of the light received by the light receiving unit;
   a calculator configured to calculate a variation in the light reception amount per unit time based on the light reception amount sampled by the sampling unit;
   a setting unit configured to set as a threshold a light reception amount corresponding to the variation in the light reception amount per unit time when the variation in the light reception amount per unit time satisfies a predetermined condition; and a detector configured to detect the object by comparison between the light reception amount of the light received by the light receiving unit and the threshold.

2. The sensor according to claim 1, wherein the sampling unit samples the light reception amount of the light received by the light receiving unit with a constant period.

3. The sensor according to claim 1, wherein
the calculator calculates a further variation per unit time of the variation in the light reception amount per unit time, and
when the further variation per unit time is larger than a defined value, the setting unit excludes a light reception amount corresponding to the further variation per unit time from being a threshold setting target.

4. The sensor according to claim 1, wherein, when a plurality of variations in the light reception amount per unit time satisfy the predetermined condition, the setting unit sets the threshold based on results of weighting respective light reception amounts corresponding to the plurality of variations in the light reception amount per unit time.

5. The sensor according to claim 1, wherein, while the detector detects the object by using the threshold, the setting unit updates the threshold to a newly set threshold based on the light reception amount sampled by the sampling unit.

6. A method for setting a threshold of a sensor which detects an object by reception of light from a light projecting unit in a light receiving unit and by comparison between a light reception amount of the light received by the light receiving unit and a threshold, the method comprising:
sampling the light reception amount of the light received by the light receiving unit;
calculating a variation in the light reception amount per unit time based on the light reception amount sampled by the sampling unit; and
setting as the threshold a light reception amount corresponding to the variation in the light reception amount per unit time when the variation in the light reception amount per unit time satisfies a predetermined condition.

7. The sensor according to claim 2, wherein
the calculator calculates a further variation per unit time of the variation in the light reception amount per unit time, and
when the further variation per unit time is larger than a defined value, the setting unit excludes a light reception amount corresponding to the further variation per unit time from being a threshold setting target.

8. The sensor according to claim 2, wherein, when a plurality of variations in the light reception amount per unit time satisfy the predetermined condition, the setting unit sets the threshold based on results of weighting respective light reception amounts corresponding to the plurality of variations in the light reception amount per unit time.

9. The sensor according to claim 3, wherein, when a plurality of variations in the light reception amount per unit time satisfy the predetermined condition, the setting unit sets the threshold based on results of weighting respective light reception amounts corresponding to the plurality of variations in the light reception amount per unit time.

10. The sensor according to claim 7, wherein, when a plurality of variations in the light reception amount per unit time satisfy the predetermined condition, the setting unit sets the threshold based on results of weighting respective light reception amounts corresponding to the plurality of variations in the light reception amount per unit time.

11. The sensor according to claim 2, wherein, while the detector detects the object by using the threshold, the setting unit updates the threshold to a newly set threshold based on the light reception amount sampled by the sampling unit.

12. The sensor according to claim 3, wherein, while the detector detects the object by using the threshold, the setting unit updates the threshold to a newly set threshold based on the light reception amount sampled by the sampling unit.

13. The sensor according to claim 4, wherein, while the detector detects the object by using the threshold, the setting unit updates the threshold to a newly set threshold based on the light reception amount sampled by the sampling unit.

14. The sensor according to claim 7, wherein, while the detector detects the object by using the threshold, the setting unit updates the threshold to a newly set threshold based on the light reception amount sampled by the sampling unit.

15. The sensor according to claim 8, wherein, while the detector detects the object by using the threshold, the setting unit updates the threshold to a newly set threshold based on the light reception amount sampled by the sampling unit.

16. The sensor according to claim 9, wherein, while the detector detects the object by using the threshold, the setting unit updates the threshold to a newly set threshold based on the light reception amount sampled by the sampling unit.

17. The sensor according to claim 10, wherein, while the detector detects the object by using the threshold, the setting unit updates the threshold to a newly set threshold based on the light reception amount sampled by the sampling unit.

* * * * *